(12) United States Patent
Kato

(10) Patent No.: US 7,804,203 B2
(45) Date of Patent: Sep. 28, 2010

(54) WIRELESS CHIP

(75) Inventor: Kiyoshi Kato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 490 days.

(21) Appl. No.: 11/661,137

(22) PCT Filed: Sep. 7, 2005

(86) PCT No.: PCT/JP2005/016872

§ 371 (c)(1),
(2), (4) Date: Feb. 26, 2007

(87) PCT Pub. No.: WO2006/028258

PCT Pub. Date: Mar. 16, 2006

(65) Prior Publication Data

US 2008/0093934 A1     Apr. 24, 2008

(30) Foreign Application Priority Data

Sep. 9, 2004   (JP)   ............................ 2004-263120

(51) Int. Cl.
   *H02J 17/00*   (2006.01)
(52) U.S. Cl. ..................................... 307/149
(58) Field of Classification Search .................. 307/149
   See application file for complete search history.

(56) References Cited

U.S. PATENT DOCUMENTS 6,809,498 B2    10/2004   Nakamura et al.
2003/0020521 A1*  1/2003   Lee et al. .................... 327/113

2004/0001453 A1   1/2004   Kawai et al.

FOREIGN PATENT DOCUMENTS

| EP | 1 263 114 | 12/2002 |
|----|-----------|---------|
| EP | 1 722 284 | 11/2006 |
| EP | 1 724 649 | 11/2006 |
| EP | 1 729 187 | 12/2006 |

(Continued)

OTHER PUBLICATIONS

International Search Report (Application No. PCT/JP2005/016872) dated Nov. 29, 2005.

(Continued)

*Primary Examiner*—Fritz M Fleming
*Assistant Examiner*—Dru M Parries
(74) *Attorney, Agent, or Firm*—Eric J. Robinson; Robinson Intellectual Property Law Office, P.C.

(57) ABSTRACT

The size of a wireless chip is often determined according to an antenna circuit thereof. Power source voltage or power supplied to the wireless chip can be more easily received with a larger antenna. On the other hand, there has been an increasing demand for a compact wireless chip, and it is thus necessary to downsize an antenna. In view of this, the invention provides a wireless chip capable of data communication with a small antenna, namely a compact wireless chip having an improved communicable distance. A power source circuit of an ID chip of the invention generates a higher power source voltage than a power source voltage generated in a conventional ID chip, by using a boosting power source circuit having a boosting circuit and a rectifier circuit.

9 Claims, 23 Drawing Sheets

FOREIGN PATENT DOCUMENTS

| | | |
|---|---|---|
| JP | 01-206482 | 8/1989 |
| JP | 11-261339 | 9/1999 |
| JP | 2001-167238 | 6/2001 |
| JP | 2001-286080 | 10/2001 |
| JP | 2002-176141 | 6/2002 |
| JP | 2003-088005 | 3/2003 |
| JP | 2003-123033 | 4/2003 |
| JP | 2003-348773 | 12/2003 |
| JP | 2004-023765 | 1/2004 |

OTHER PUBLICATIONS

Written Opinion (Application No. PCT/JP2005/016872) dated Nov. 29, 2005.

Udo Karthaus et al., Fully Integrated Passive UHF RFID Transponder IC With 16.7-µW Minimum RF Input Power, IEEE Journal of Solid-State Circuits, vol. 38, No. 10, Oct. 2003, pp. 1602-1608.

* cited by examiner

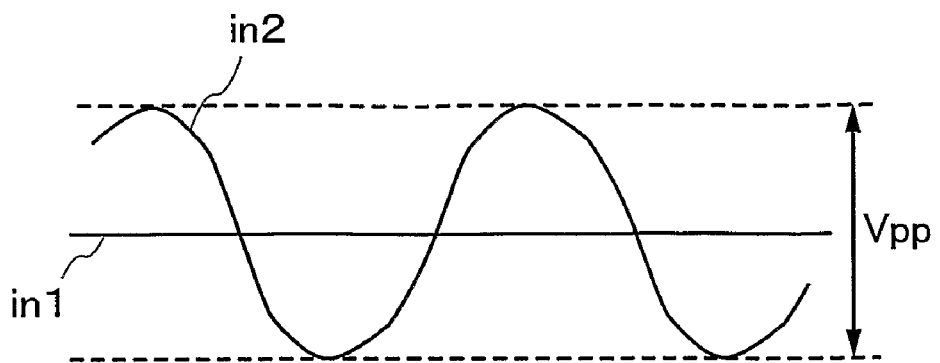
FIG. 3A
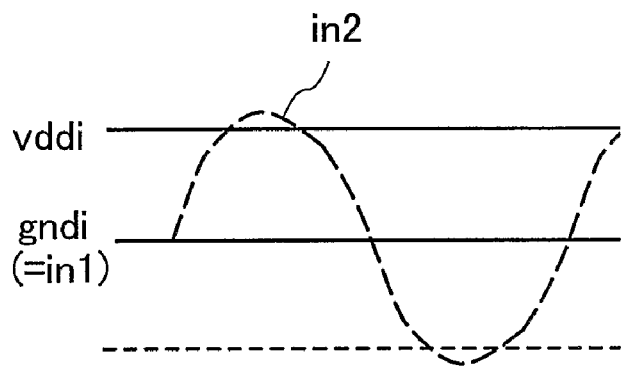
FIG. 3B
VDD ─────────────────
vddi ─ ─ ─ ─ ─ ─ ─ ─ ─
GND ─────────────────
(=gndi)
FIG. 3C

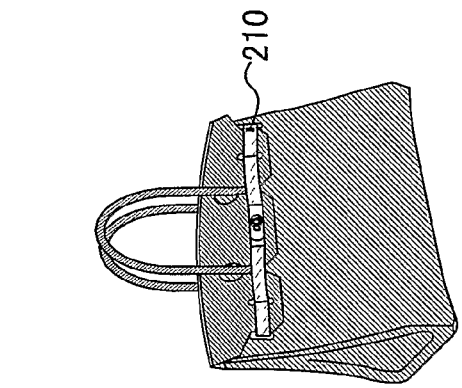
FIG. 21A
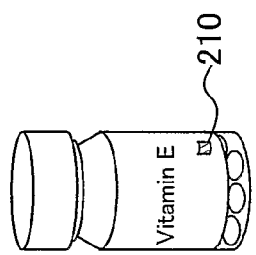
FIG. 21B
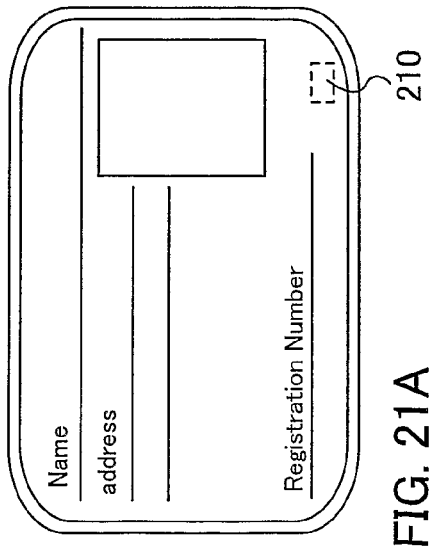
FIG. 21C
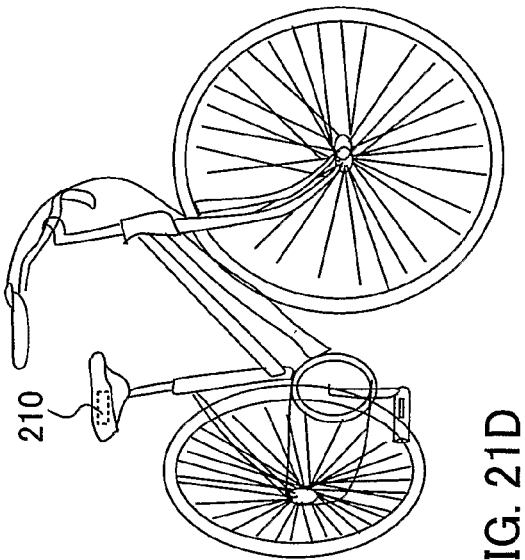
FIG. 21D
FIG. 21E bridge # WIRELESS CHIP

TECHNICAL FIELD

The present invention relates to a wireless chip and a manufacturing method thereof.

BACKGROUND ART

In recent years, wireless chips for wireless data transmission reception are actively developed. The wireless chip for data transmission/reception is called an IC chip, an RF tag, an RFID, a wireless tag, an electronic tag, a wireless processor, a wireless memory and the like, and most of the wireless chips which are currently in practical use are formed using a silicon substrate.

Such a wireless chip is attracting attention as an alternative to a barcode having a small amount of data so as to be used for merchandise management (see Patent Document 1). In addition, a contactless IC card having a high security function is also attracting attention in order to prevent the counterfeiting or unauthorized use.

FIG. 23 shows an example of a conventional configuration of such a wireless chip. Shown in FIG. 23 is a wireless chip which reads and writes data from/to a memory in accordance with an instruction received. A wireless chip 201 includes an antenna circuit 202, a power source circuit 203, a demodulation circuit 204, a modulation circuit 205, a memory IF 206 and a memory 207.

The antenna circuit 202 receives electromagnetic waves and generates AC signals. The power source circuit 203 rectifies the AC signals and generates power to be supplied to other circuits. Each of the demodulation circuit 204, the modulation circuit 205, the memory IF 206 and the memory 207 extracts an instruction or data from the AC signal received, reads and writes data from/to a memory in accordance with the decoded instruction, and transmits the result.

[Patent Document 1]
Japanese Patent Laid-Open No. 2003-123033

In the invention, a wireless chip called an RFID, a contactless IC card, an ID tag, an ID card or the like is collectively called an ID chip. The size of such an ID chip is often determined according to an antenna circuit thereof. In general, power source voltage or power supplied to an ID chip can be more easily received with a larger antenna. On the other hand, it is less easily received with a smaller antenna, thereby the communication distance becomes shorter. For example, an ID chip of an electromagnetic induction type using a frequency band of 13.56 MHz can obtain, with an antenna having a size of a credit card, a communication distance of about 80 cm; however, it is decreased to about 1 cm with an antenna of about 5 mm square.

In this manner, when the antenna is downsized, the communication distance becomes shorter and the application thereof is limited accordingly; therefore, it is vital to improve the communication distance.

In view of the foregoing, it is a primary object of the invention to provide an ID chip capable of data communication with a small antenna, namely a compact ID chip having an improved communicable distance.

DISCLOSURE OF INVENTION

In view of the foregoing problems, a power source circuit of an ID chip of the invention generates a higher power source voltage than a power source voltage generated in a conventional ID chip. As a result, the communication distance can be improved. That is, the invention realizes a configuration where internal circuits of an ID chip can operate stably even when a signal amplitude obtained from an antenna circuit is small in order to improve the communication distance of the ID chip.

According to one mode of the invention, a wireless chip is provided which includes a circuit for rectifying and boosting the output of an antenna circuit.

According to another mode of the invention, a wireless chip is provided which includes an antenna circuit and a boosting circuit. A clock signal input terminal of the boosting circuit is connected to an output of the antenna circuit directly or though a capacitor.

According to another mode of the invention, a wireless chip is provided which includes an antenna circuit having a first terminal and a second terminal for outputting two signals, and a boosting circuit having two terminals for receiving a 2-phase clock signal. The two terminals of the boosting circuit are connected to the first terminal and the second terminal of the antenna circuit respectively directly or through capacitors.

According to one specific mode of the invention, a wireless chip is provided which includes an antenna circuit having a first terminal and a second terminal for outputting 2 signals, and a boosting power source circuit. The boosting power source circuit includes a rectifier circuit having a third terminal for receiving a signal from the first terminal of the antenna circuit, a fourth terminal for receiving a signal from the second terminal of the antenna circuit, and a fifth terminal for outputting a potential; and a boosting circuit having a sixth terminal for receiving a signal from the first terminal of the antenna circuit, a seventh terminal for receiving a signal from the second terminal of the antenna circuit, an eighth terminal for receiving the potential, a ninth terminal for outputting a power source potential, and a tenth terminal for outputting a ground potential. The first terminal of the antenna circuit is connected to the third terminal of the rectifier circuit and the sixth terminal of the boosting circuit directly or through a capacitor. The second terminal of the antenna circuit is connected to the fourth terminal of the rectifier circuit and the seventh terminal of the boosting circuit directly or through a capacitor. The fifth terminal of the rectifier circuit is connected to the eighth terminal of the boosting circuit. The power source potential is higher than the aforementioned potential.

According to another specific mode of the invention, a wireless chip is provided which has an antenna circuit having a first terminal and a second terminal for outputting two signals, and a boosting power source circuit. The boosting power source circuit includes a rectifier circuit having a third terminal for receiving a signal from the first terminal of the antenna circuit, a fourth terminal for receiving a signal from the second terminal of the antenna circuit, a fifth terminal for outputting a first potential, and an eleventh terminal for outputting a second potential; and a boosting circuit having a sixth terminal for receiving a signal from the first terminal of the antenna circuit, a seventh terminal for receiving a signal from the second terminal of the antenna circuit, an eighth terminal for receiving the first potential, a twelfth terminal for receiving the second potential, a ninth terminal for outputting a power source potential, and a tenth terminal for outputting a ground potential. The first terminal of the antenna circuit is connected to the third terminal of the rectifier circuit and the sixth terminal of the boosting circuit directly or through a capacitor. The second terminal of the antenna circuit is connected to the fourth terminal of the rectifier circuit and the seventh terminal of the boosting circuit directly or through a capacitor. The fifth terminal and the eleventh terminal of the rectifier circuit are connected to the eighth terminal and the twelfth terminal of the boosting circuit respectively. The power source potential is higher than the first potential.

The second potential is, for example, a ground potential.

In the invention, the boosting power source circuit is constructed of analog circuits.

In the invention, a potential difference between signals inputted to the input terminals of a boosting circuit has an analog AC waveform.

A boosting power source circuit of the invention can operate normally and generate a power source voltage which is high enough to operate a logic circuit even in the case where a signal amplitude large enough to operate the logic circuit is not obtained with a conventional power source circuit. As a result, a more compact ID chip having an improved communicable distance can be realized.

BRIEF DESCRIPTION OF DRAWINGS

FIGS. 3A to 3C are charts each showing the behavior of a boosting power source circuit of the invention.

FIGS. 21A to 21E show modes of merchandise each mounting a wireless chip of the invention.

BEST MODE FOR CARRYING OUT THE INVENTION

Figure 1:
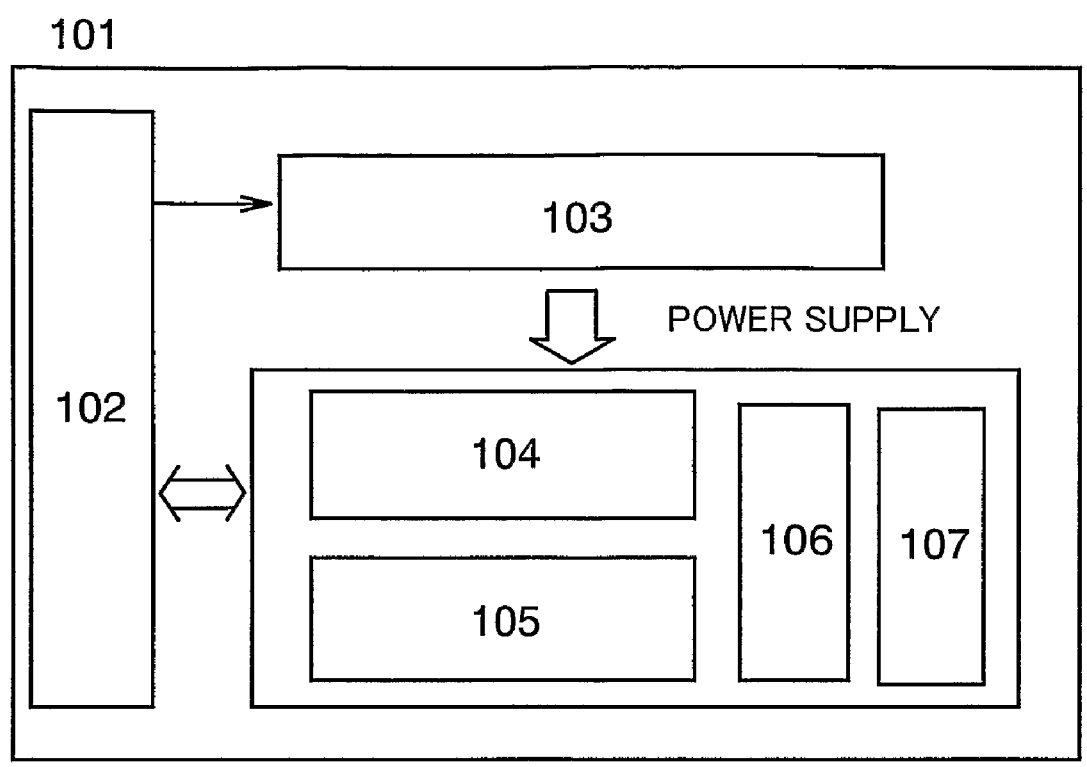
FIG. 1 is a block diagram of an ID chip of the invention.

Although the invention will be fully described by way of embodiment modes and embodiments with reference to the accompanying drawings, it is to be understood that various changes and modifications will be apparent to those skilled in the art. Therefore, unless otherwise such changes and modifications depart from the scope of the invention, they should be construed as being included therein. Note that the same portions or portions having the same functions are denoted by the same reference numerals, and the description thereof will be made only once.

Embodiment Mode 1

In this embodiment mode, a configuration of an ID chip of the invention is described.

As shown in FIG. 1, an ID chip 101 includes an antenna circuit 102, a boosting power source circuit 103, a demodulation circuit 104, a modulation circuit 105, a memory interface (IF) 106 and a memory 107. Such IC chip 101 reads or writes data from/to the memory 107 in accordance with an instruction (signal) received by the antenna circuit 102. The boosting power source circuit 103 has a function to generate a boosted power source voltage based on an AC signal generated in the antenna circuit 102, and supply power to the demodulation circuit 104, the modulation circuit 105, the memory interface (IF) 106, the memory 107 and the like.

The boosting power source circuit 103 of the invention can, even in the case where a signal amplitude large enough to operate an internal logic circuit of a demodulation circuit or a modulation circuit cannot be obtained, operate normally and generate a power source potential high enough to operate the logic circuit. The boosting power source circuit 103 has the following characteristics: the boosting power source circuit 103

(1) has no power source input but has two signal input terminals, and a voltage amplitude between the two terminals has an analog AC waveform; and (2) includes no logic circuit but includes only analog circuits.

The characteristic (1) is required because the ID chip has no power source input but only receives signals from an antenna. The characteristic (2) is required because no power source voltage for operating a logic circuit is generated other than the boosted power source voltage.

Note that a conventional boosting circuit receives a multi-phase clock signal, a power source potential and a ground potential. Thus, it is difficult to apply the conventional boosting circuit to the boosting power source circuit of the invention which has two signal input terminals for receiving analog signals. In addition, it is also difficult to apply a logic circuit which generates clock signals having different phases to the boosting power source circuit of the invention.

Therefore, the boosting power source circuit 103 of the invention includes a rectifier circuit and a boosting circuit, and a power source potential supplied to the boosting circuit is generated by the rectifier circuit. In addition, the boosting power source circuit 103 of the invention uses two signals inputted from the antenna instead of the conventional multi-phase clock signals. Changes of a potential difference between the two signals with time show an analog AC waveform. In other words, the potential difference changes periodically and continuously.

Figure 2:
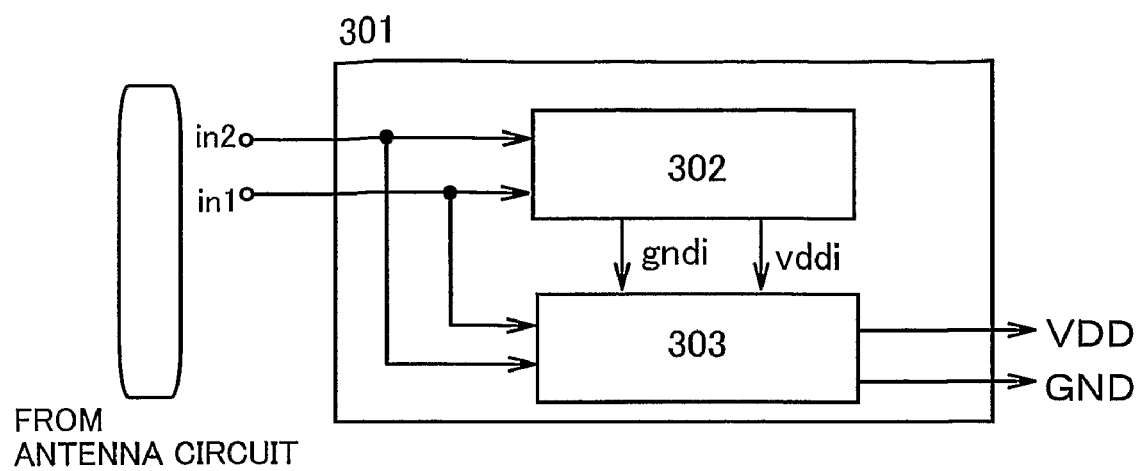
FIG. 2 is a block diagram of a boosting power source circuit of the invention.

FIG. 2 is a block diagram of the boosting power source circuit 103 of the invention and FIGS. 3A to 3C show the behavior of each node.

As shown in FIG. 2, a boosting power source circuit 301 of the invention includes a rectifier circuit 302 and a boosting circuit 303, and also has two terminals to be connected to two terminals of an antenna circuit respectively. Note that the two terminals of the antenna circuit and the two terminals of the boosting power source circuit are connected directly or through capacitors.

The two terminals of the boosting power source circuit receive from the antenna circuit, an analog AC signal having an amplitude of Vpp as shown in FIG. 3A.

The rectifier circuit 302 receives signals from the two terminals of the antenna circuit and generates a potential (vddi) and a potential (gndi). The potential (vddi) and the potential (gndi) correspond to signals each having a roughly constant potential as shown in FIG. 3B, and the potential difference therebetween is equal to or lower than the amplitude Vpp of the signal inputted from the antenna circuit.

The boosting circuit 303 has four input terminals for receiving signals from the two terminals of the antenna circuit, the potential vddi and the potential gndi, and upon receiving such signals and potentials, the boosting circuit 303 generates a power source potential VDD and a ground potential GND. A potential difference between the two signals inputted from the antenna circuit to the input terminals of the boosting circuit 303 has an analog AC waveform.

Note that in the case where the potential gndi has the same level as the potential of one of the two terminals of the antenna circuit, the potential of the terminal is not required to be inputted. Accordingly, the number of terminals can be reduced. The power source potential VDD and the ground potential GND are signals each having a roughly constant potential, and (VDD−GND)>(gndi−vddi) is satisfied. As shown in FIG. 3C, in the case where the ground potential GND and the potential gndi have the same level, the power source potential VDD outputted from the boosting circuit becomes higher than the potential vddi outputted from the rectifier circuit.

Such a boosting power source circuit can output the power source potential (VDD) and the ground potential (GND).

An internal logic circuit of a demodulation circuit or a modulation circuit which constitutes the wireless chip of the invention is characterized in that it receives the power source potential (VDD) outputted from the boosting circuit as a power source.

Next, description is made on the condition where a boosting power source circuit having the configuration shown in FIG. 2 operates normally. In the rectifier circuit 302, the constant voltage drops (the voltage drop is referred to as V1); therefore, it is required that the amplitude (Vpp) of an inputted analog AC signal be larger than the dropped voltage (V1). In the boosting circuit 303 also, a constant voltage drop occurs in each boosting stage. According to the invention, voltage boosting is performed using two signals from the antenna (given that one of the signals has a constant potential, the other signal is an analog AC signal having the amplitude (Vpp)); therefore, voltage can be boosted by (Vpp) with two boosting stages. Thus, in order to operate the boosting circuit 303 normally, the amplitude (Vpp) of the analog AC signal is required to be larger than the voltage drop (V2) of the two boosting stages. The voltage drops V1 and V2 are typically about the same level.

For example, the boosting power source circuit of the invention having six boosting stages can obtain a power source voltage of (Vpp−V1)+(Vpp−V2)×3. Needless to say, an even higher power source voltage can be generated by increasing the number of stages. Meanwhile, the power source voltage obtained in an internal rectifier circuit of a conventional ID chip is as low as (Vpp−V1).

Thus, the boosting power source circuit of the invention can operate normally and generate a power source voltage high enough to operate a logic circuit even in the case where a signal amplitude large enough to operate the logic circuit is not obtained with a conventional power source circuit. As a result, a more compact ID chip having an improved communicable distance can be realized.

Note that circuits constituting the ID chip are preferably manufactured over a glass substrate in order to improve the cost of the ID chip. Further, it is effective to peel the ID chip off the glass substrate. As a result, the glass substrate can be removed and thus the shock resistance can be improved.

Embodiment Mode 2

Description is made on a specific circuit configuration of the boosting power source circuit of the invention.

Figure 4:
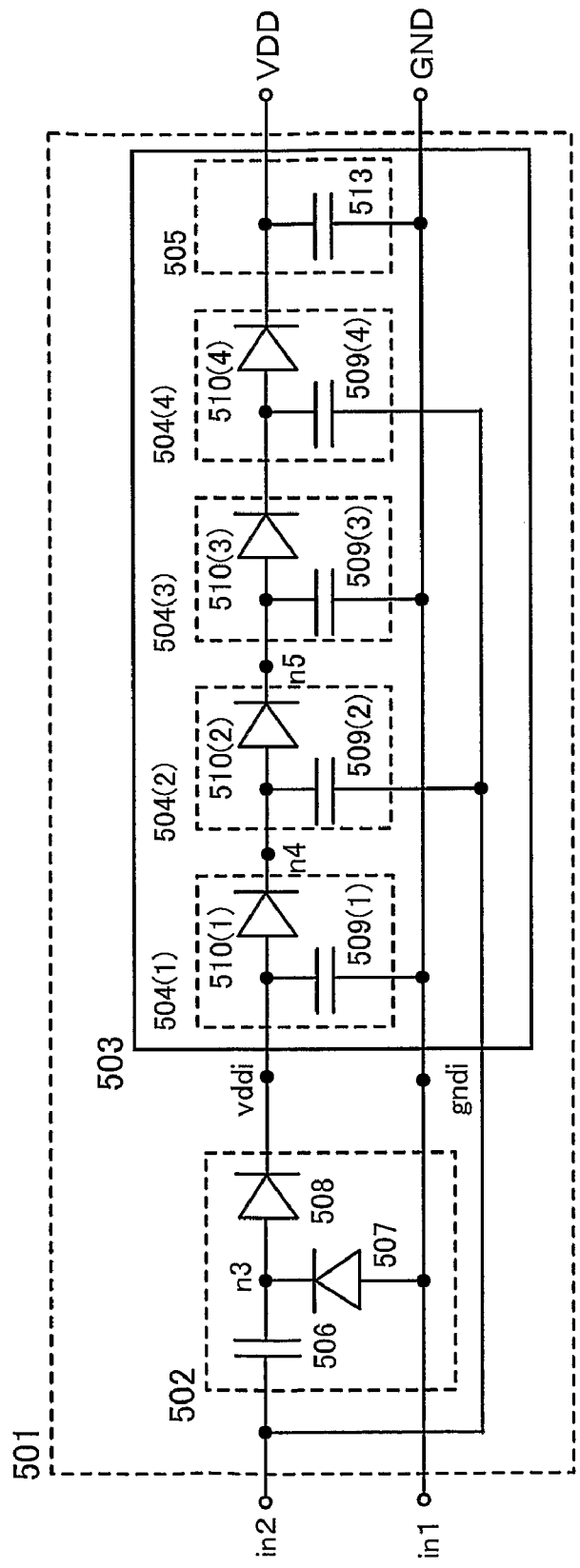
FIG. 4 is a circuit diagram of a boosting power source circuit of the invention.

A boosting power source circuit 501 shown in FIG. 4 includes a rectifier circuit 502 and a boosting circuit 503, and input terminals in1 and in2 thereof receive signals from an antenna circuit directly or through capacitors. The boosting power source circuit 501 outputs a power source potential (VDD) and a ground potential (GND).

The rectifier circuit 502 includes two diodes 507 and 508 connected in series and a capacitor 506. An input terminal of the diode 507 is connected to the input terminal in1 while an output terminal thereof (node n3) is connected to one terminal of the capacitor 506 and an input terminal of the diode 508. The other terminal of the capacitor 506 is connected to the input terminal in2. Upon input of signals to the rectifier circuit 502 from the input terminals in1 and in2, the potential vddi and the potential gndi are generated. The potential of the input terminal in1 has the same level as the potential gndi.

The boosting circuit 503 receives a signal from the input terminal in2, the potential (vddi) and the potential (gndi), and generates a power source potential (VDD) and a ground potential (GND). Specifically, the boosting circuit 503 has four stages for receiving 2-phase clocks, and it includes four boosting units 504 and a stabilizing capacitor portion 505. Two clock input terminals of the boosting circuit 503 receive signals from the input terminal in2 and the potential (gndi), and a power source input terminal thereof receives the potential (vddi). Note that although a typical boosting circuit once receives an inputted power source potential with a diode, the potential vddi is directly inputted to a boosting unit 504(1) of the boosting circuit 503 without through a diode since it is rectified by the diode 508 in the rectifier circuit 502.

Each of the boosting units 504 (i) (i=1, 2, 3 and 4 in this embodiment mode) has one capacitor 509 (1) to 509 (4), one diode 510 (1) to 510 (4), two input terminals (first and second input terminals) and one output terminal respectively. The first input terminal of the boosting unit of the first stage receives vddi, and the first input terminal of the boosting unit of the second or lower stages receives the output of the preceding stage thereof. A second input terminal of a boosting unit of an even-numbered stage receives a signal from the input terminal in2 and a second input terminal of a boosting unit of an odd-numbered stage receives the potential (gndi) which has the same level as the potential of the input terminal in1. An input terminal of each diode 510 (i) is connected to the first input terminal, and an output terminal thereof corresponds to the output terminal of the boosting unit. The capacitor 509 (*i*) is connected between the first input terminal and the second input terminal.

The output of the boosting unit 504 (4) as the last stage in this embodiment mode is outputted as the power source potential (VDD) from the boosting circuit 503. In addition, GND of the boosting power source circuit 501 is connected to the potential (gndi); therefore, they have the same level.

The stabilizing capacitor portion 505 has a capacitor 513 between the power source potential (VDD) and the ground potential (GND), which can stabilize the power.

In the invention, the ground potential (gndi) is connected to one of the clock input terminals; therefore, the boosting units are preferably provided in even number. However, the number of the boosting units is not limited to 4 as shown in FIG. 4, and an even-numbered units such as 2 or 6 units may be provided as well. Further, the ground potential (GND) of the boosting power source circuit may be connected not to the input terminal in1 but to the input terminal in2, and the boosting units may be provided in odd number as well.

In the boosting circuit having such a plurality of boosting units, voltage can be boosted in the boosting unit of an odd-numbered stage by using a signal inputted from the input terminal in1 while voltage can be boosted in the boosting unit of an even-numbered stage by using a signal inputted from the input terminal in2.

Next, description is made with reference to the waveform shown in FIGS. 5A to 5D on the operation of the boosting power source circuit shown in FIG. 4.

Figure 5A:
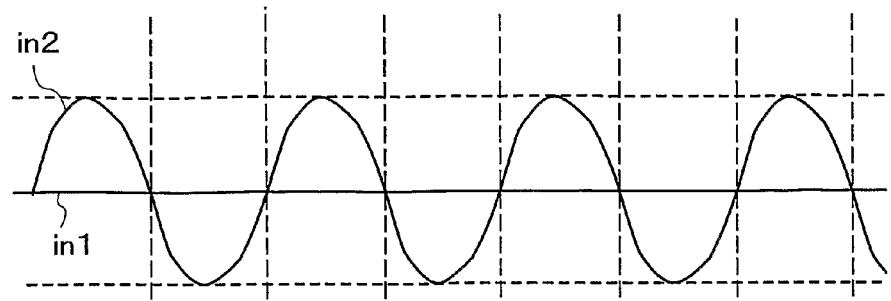
FIGS. 5A to 5D are charts each showing the behavior of a boosting power source circuit of the invention.

FIG. 5A shows the behavior of the input terminals in1 and in2 which receive signals from the antenna circuit. In the case where a potential of a signal, for example a potential of a signal of the input terminal in1 is constant, a potential of a signal of the other input terminal in2 is an analog AC signal which swings with the constant potential as a central potential.

Figure 5B:
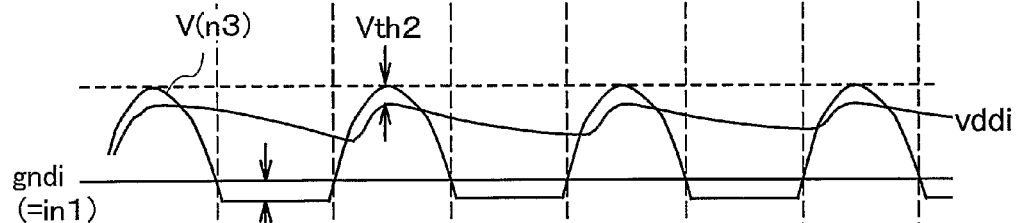

FIG. 5B shows a potential of the node n3 in the rectifier circuit 502, and also shows the behavior of the output potentials vddi and gndi. The potential gndi is connected to the input terminal in1; therefore, it has a constant potential similarly to FIG. 5A. The node n3 is coupled with a signal from the input terminal in2 by the capacitor 506; therefore, it behaves as an analog AC signal. The diode 507 is turned on in the case where the node n3 is at a lower potential than the potential (gndi) by the level of the threshold voltage (Vth1) of the diode 507 or more; therefore, the potential V(n3) of the node n3 can be maintained at a potential of (gndi−Vth1) or higher. The diode 508 is turned on in the case where the node n3 is at a higher potential than the output potential Vddi by the level of the threshold voltage (Vth2) of the diode 508 or more; therefore, vddi can be maintained at (V(n3)−Vth2) or higher. As a result, the node n3, gndi and vddi show the behavior as shown in FIG. 5B. Note that in FIG. 5B, vddi is roughly a constant potential because the potential is held by the capacitor 509(1) between vddi and gndi of the subsequent stage.

Figure 5C:
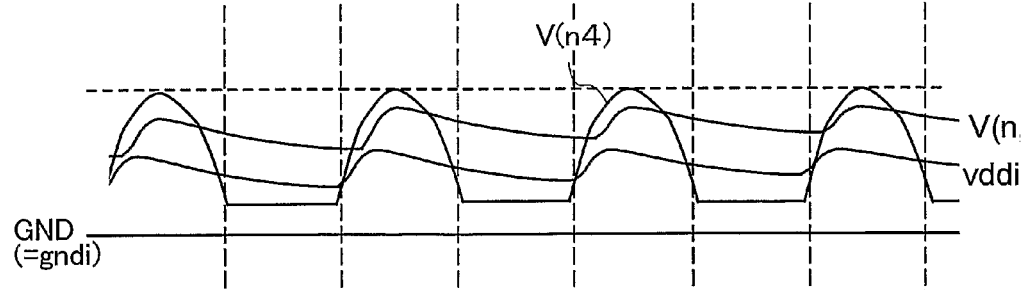

FIG. 5C shows the behavior of the boosting units 504(1) and 504(2) of the first and second stages respectively in the boosting circuit 503. An input signal vddi of the boosting unit 504(1) of the first stage is set at roughly a constant potential by the capacitor 509(1) connected between gndi and vddi. The potential V(n4) of the node n4 which is the output signal of the boosting unit 504(1) of the first stage is coupled with a signal inputted from the input terminal in2 by the capacitor 509(2); therefore, it behaves as an analog AC signal. Note that the potential V(n4) of the node n4 is maintained at (vddi−Vth3(1)) or higher by the function of the diode 510(1) (having a threshold voltage of Vth3(1)); therefore, the node n4 behaves as shown in FIG. 5C. The potential V(n5) of the node n5 which is the output potential of the boosting unit 504(2) of the second stage is maintained at (V(n4)−Vth3(2)) or higher by the diode 510(2) (having a threshold voltage of Vth3(2)). The potential is maintained by the capacitor 509(3) between gndi and the n5 of the boosting unit 504 (3) of the third stage; therefore, the node n5 has a potential as shown in FIG. 5C which is rectified and boosted.

Figure 5D:
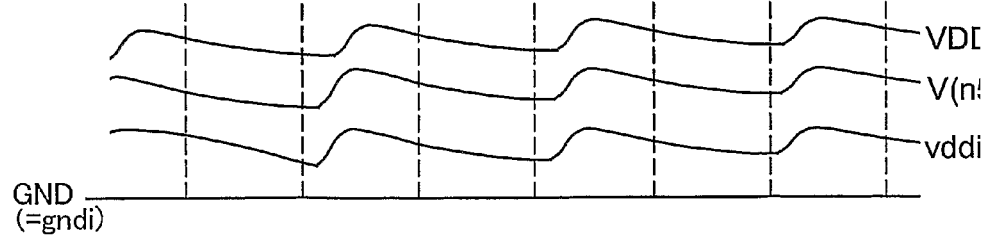

The behavior of the boosting units 504(3) and 504(4) of the third and fourth stages respectively are similar. As a result, the boosting power source circuit 501 behaves as shown in FIG. 5(D). In FIG. 5D, the input terminal in1, gndi and GND are the ground potential, vddi is a rectified potential, V(n5) is a potential after subjected to two stages of boosting and VDD is a potential after subjected to four stages of boosting.

In this manner, a boosting power source circuit can be realized which receive signals at the input terminals in1 and in2 from an antenna circuit, and outputs the power source potential VDD and the ground potential GND.

Note that the operating condition of the circuit of the invention follows: vddi>gndi is satisfied in order to operate the rectifier circuit 502; and VDD>V(n5)>vddi is satisfied in order to operate the boosting circuit 503. For example, provided that the amplitude of a signal from the input terminal in2 is Vpp, and there is no loss of the amplitude due to capacitive coupling, the rectifier circuit 502 operates in the case where (Vpp−Vth1−Vth2)>0 is satisfied and the boosting circuit 503 operates normally in the case where (Vpp−Vth3 (1)−Vth3(2))>0 and (Vpp−Vth3(3)−Vth3(4))>0 are satisfied. Note that in the case of constructing each diode using a diode-connected transistor, the threshold voltage of the diode corresponds to the threshold voltage of the transistor (Vth); therefore, (Vpp−2×Vth)>0 is the operating condition.

In general, a power source potential obtained by rectifying an input signal having an amplitude of about twice as large as the threshold voltage is low, and it is thus difficult to operate all the circuits in a logic circuit or an ID chip. However, the boosting power source circuit of the invention can operate normally with an input signal having an amplitude of about twice as large as the threshold voltage, which can operate all the circuits in a logic circuit or an ID chip stably by using the generated boosted power source voltage. As a result, an ID chip having an improved communicable distance can be realized, and further downsizing thereof can be achieved.

Embodiment 1

Figure 6:
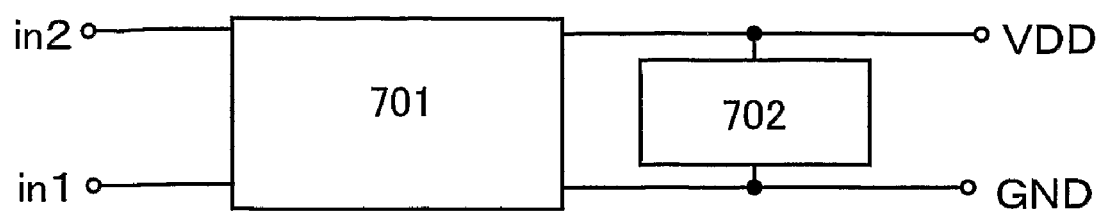
FIG. 6 is a block diagram of a boosting power source circuit of the invention.

In this embodiment, description is made with reference to FIG. 6 on the case where a limiter circuit is provided at the output of the boosting power source circuit of the invention.

An amplitude of an input signal of an ID chip is dependent on the communication distance and the intensity of a signal source. A power source potential generated by a boosting power source circuit is dependent on the amplitude and frequency of the input signal, the number of boosting stages of the boosting power source circuit and the threshold voltage of a diode. As a result, the power source potential generated by the boosting power source circuit is dependent on the communication distance and the intensity of a signal source.

The boosting circuit of the invention operates with high performance even in the case where an amplitude of an input signal is small. Meanwhile, in the case where an amplitude of an input signal is large, there is a possibility that an extremely high power source voltage is generated. Therefore, it is preferable as shown in FIG. 6 that a limiter circuit 702 be connected between GND and VDD which are the outputs of a boosting power source circuit 701.

By the limiter circuit, a generated power source potential can be maintained at a preset potential or lower. Note that the limiter circuit preferably has a zener diode, a diode-connected transistor, a diode which is connected to an operational amplifier or the like.

Embodiment 2

In this embodiment, description is made on an example of a block configuration of an ID chip having the boosting power source circuit of the invention. The ID chip shown in this embodiment has a function to read out data from a mask ROM in accordance with a readout instruction from a reader/writer.

Figure 7:
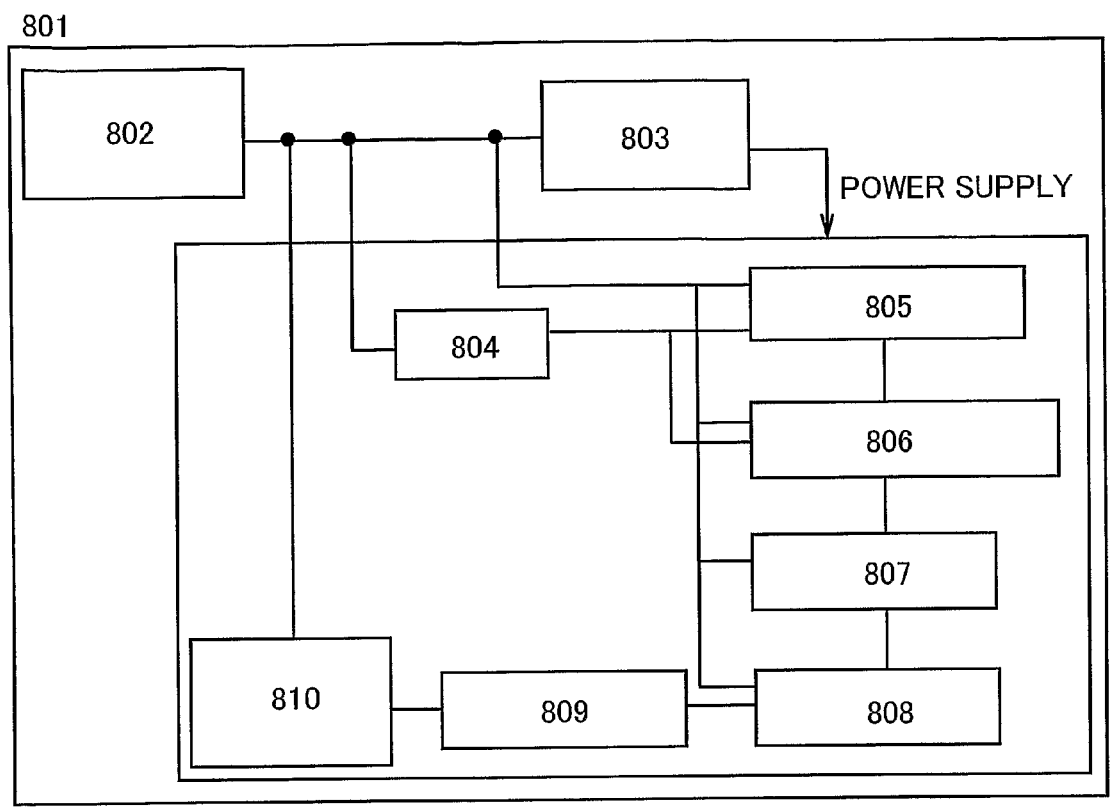
FIG. 7 is a block diagram of a wireless chip of the invention.

As shown in FIG. 7, an ID chip 801 includes an antenna circuit 802 having an antenna and a resonant capacitor, a boosting power source circuit 803, a demodulation circuit 804, a clocked controller 805, a code recognition/determination circuit 806, a memory controller 807, a mask ROM 808, an encoding circuit 809 and a modulation circuit 810.

The antenna circuit 802 receives an electromagnetic wave outputted from a reader/writer and generates AC signals. The generated AC signals are inputted to the boosting power source circuit 803, the demodulation circuit 804 and the clock controller 805 directly or through capacitors. The boosting power source circuit 803 generates a boosted power source voltage which is boosted and rectified based on the AC signals. The generated power source voltage is supplied to all the other circuits in the ID chip as a power. The demodulation circuit 804 demodulates an instruction code in the AC signals. The clock controller 805 generates clock signals based on the AC signals. The demodulated signal is recognized and determined a reading code by the code recognition/determination circuit 806, and outputs the result to the memory controller 807. The memory controller 807 controls the reading of the mask ROM 808 based on the determination result. The data read out from the mask ROM 808 is encoded in the encoding circuit 809, and modulated by the modulation circuit 810.

Embodiment 3

In this embodiment, description is made on an example of a layout of an ID chip having the boosting power source circuit of the invention.

Figure 8:
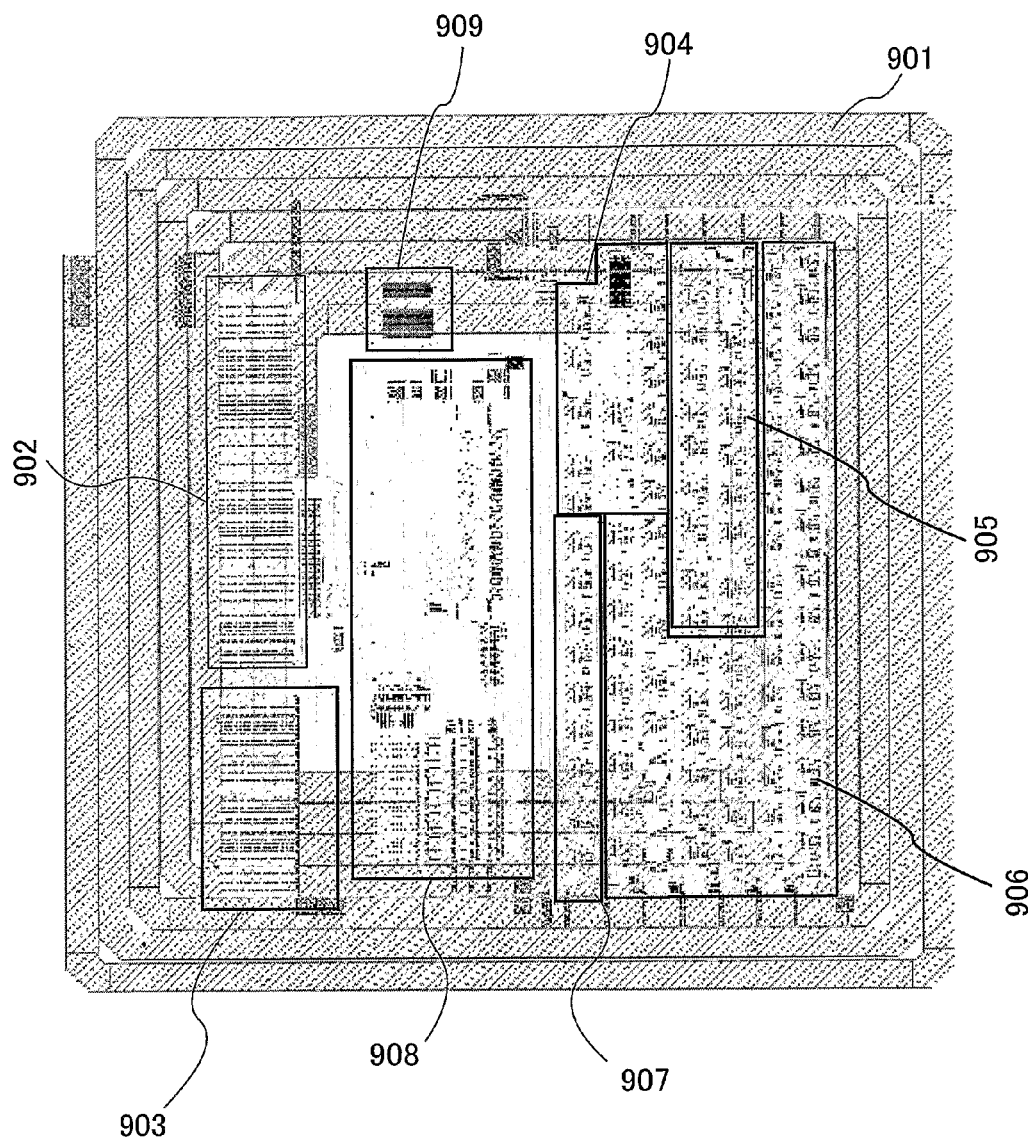
FIG. 8 shows a layout pattern of a wireless chip of the invention.

FIG. 8 shows an example of a layout for constructing the ID chip described in Embodiment 2. The ID chip includes an antenna 901, a resonant capacitor 902, a boosting power source circuit 903, a demodulation circuit 904, a clock controller 905, a code recognition/determination circuit 906, a memory controller 907, a mask ROM, encoding circuit and address generating circuit 908 and a modulation circuit 909.

Note that each circuit shown in FIG. 8 is constructed of thin film transistors. As a result, the unit cost of the ID chip can be reduced.

The ID chip shown in FIG. 8 has a size of about 6 mm square, and operates with an electromagnetic induction method using a frequency band of 13.56 MHz. The antenna 901 is formed in a coil form over a circuit, and reduced in size to about the same size of the circuit constituting the ID chip.

In this manner, by using the boosting power source circuit 903 of the invention, communication distance can be improved as compared to a conventional power source circuit, thereby such a small-size antenna can be realized. As a result, downsizing of the IC chip can be achieved.

Embodiment 4

In this embodiment, description is made on manufacturing steps of a thin film integrated circuit including a boosting power source circuit by a stress peel-off method (hereinafter also referred to as "SPOP (Stress Peel Off Process)").

Figure 9A:
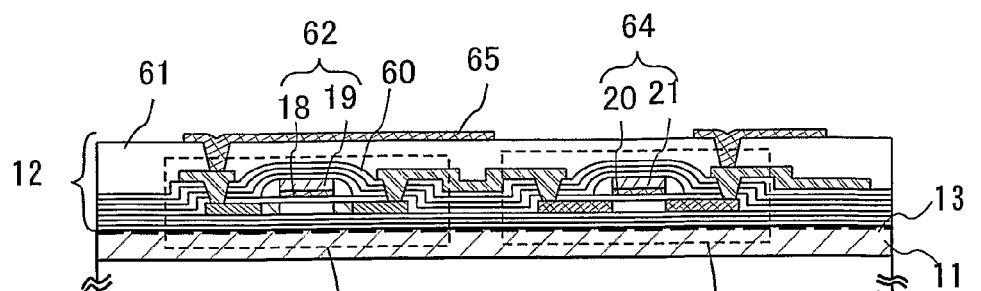
FIGS. 9A to 9E are diagrams showing a manufacturing method of a wireless chip of the invention.

First, as shown in FIG. 9A, a peeling layer 11 is formed over a first substrate 210 having an insulating surface. Note that the first substrate is only required be hard enough to resist a subsequent peeling step, and it may be a glass substrate, a quartz substrate, a ceramic substrate, a silicon substrate, a metal substrate or a stainless substrate, for example. The peeling layer may be formed to have a single-layer structure or a stacked-layer structure of an element selected from W, Ti, Ta, Mo, Nd, Ni, Co, Zr, Zn, Ru, Rh, Pd, Os and Ir, an alloy material or a compound material containing such element. When the peeling layer 11 has a stacked-layer structure, it may preferably have a tungsten layer, a molybdenum layer or a mixed layer of tungsten and molybdenum (e.g., alloy of W and Mo: $W_xMo_{1-x}$) as a first layer, and a second layer containing oxide, nitride, oxynitride or nitride oxide of tungsten, molybdenum or a mixture of tungsten and molybdenum.

Note that in the case of forming a stacked-layer structure having a tungsten layer and a layer containing oxide of tungsten, a silicon oxide layer may be formed over the tungsten layer so that a layer containing oxide of tungsten is formed at the interface between the tungsten layer and the silicon oxide layer. This is the same in the case of forming a layer containing nitride, oxynitride or nitride oxide of tungsten, in which case a tungsten layer is formed first and a silicon nitride layer, a silicon oxynitride layer or a silicon nitride oxide layer is formed thereover. Note that the silicon oxide layer, the silicon oxynitride layer, the silicon nitride oxide layer or the like which is formed over the tungsten layer can function as a base insulating layer.

As a manufacturing method of a metal film, for example, sputtering may be employed using a metal target. Note that the thickness of the metal film may be 10 to 200 nm, or more preferably 50 to 75 nm.

In addition, nitrogen or oxygen may be added to the metal film. As the adding method, ion implantation of nitrogen or oxygen into the metal film may be performed, or sputtering may be performed with a deposition chamber filled with a nitrogen gas or an oxygen gas. Alternatively, metal nitride may be employed as a target.

In this manner, by appropriately setting the method for forming a metal film, a peeling step can be controlled, thereby a wide margin of process can be provided. Specifically, the heating temperature for peeling or the necessity of heat treatment can be controlled.

After that, a layer to be peeled 12 having elements of a thin film integrated circuit is formed over the peeling layer 11. In this embodiment, thin film transistors (TFTs) 36 and 37 are employed as the elements of the thin film integrated circuit, each of which has at least a channel forming region with a thickness of 10 to 200 nm which is formed of a semiconductor film isolated in island shapes. The thin film transistors (TFTs) 36 and 37 have the semiconductor films, gate insulating films, gate electrodes 62 and 64 in which first conductive films (lower-layer electrodes) 18 and 20 and second conductive films (upper-layer electrodes) 19 and 21 are stacked, and insulating films over the gate electrodes respectively. The thin film transistor (TFT) 36 has n-type conductivity, and the semiconductor film thereof has an LDD (Lightly Doped Drain) structure having a low concentration impurity region and a high concentration impurity region. The thin film transistor 37 has p-type conductivity and the semiconductor film thereof has a single drain structure including only a high concentration impurity region. Note that the thin film transistor of the invention is not limited to the aforementioned structures.

The thin film transistors (TFTs) 36 and 37 constitute the boosting power source circuit 103, the demodulation circuit 104, the modulation circuit 105, the memory interface (IF) 106 and the memory 107.

As a protective film 60 of the thin film transistors, a nitride film such as a nitride oxide silicon (SiNO or SiON) film is preferably provided. The protective film 60 may have either a single-layer structure or a stacked-layer structure. Over the protective film 60, an insulating film is formed to function as an interlayer insulating film 61. The interlayer insulating film 61 may be formed of an organic material or an inorganic material. As the organic material, polyimide, acrylic, polyamide, polyimide amide, resist, benzocyclobutene, siloxane or polysilazane may be employed. "Siloxane" is composed of a skeleton formed by the bond of silicon (Si) and oxygen (O), in which an organic group containing at least hydrogen (e.g., an alkyl group or aromatic hydrocarbon) is used as a substituent. Alternatively, a fluoro group may be used as the substituent. Further alternatively, a fluoro group and an organic group containing at least hydrogen may be used as the substituent. Polysilazane is a formed by using as a starting material a polymer material having the bond of silicon (Si) and nitrogen (N), which is a liquid material containing so-called polysilazane. As the inorganic material, an insulating film containing oxygen or nitrogen such as silicon oxide ($SiO_x$), silicon nitride ($SiN_x$), silicon oxynitride ($SiO_xN_y$) (x>y) or silicon nitride oxide ($SiN_xO_y$) (x>y) (x, y=1, 2, . . . ) may be used. Further, a stacked-layer structure of such insulating films may be employed as the interlayer insulating film. In particular, when the interlayer insulating film is formed using an organic material, planarity can be improved whereas moisture and oxygen are absorbed by the organic material. In order to prevent this, a stacked-layer structure is preferably employed in which an insulating film containing an inorganic material is formed on an organic material. In particular, when an insulating film containing nitrogen is used as the inorganic material, intrusion of alkali ion such as Na can be prevented. In the case where the diffusion of materials for the antenna formed later is concerned in particular, an insulating film containing nitrogen is preferably formed over the interlayer insulating layer 61.

After that, a conductive film 65 is formed to function as a wiring connected to the thin film transistors (TFTs) 36 and 37. The conductive film 65 can also function as an antenna.

Further, a protective film may be formed covering the conductive film 65. The protective film can be formed using an insulator formed of an organic material or an inorganic material. For example, in the case of an organic material, an epoxy resin may be employed. In the case of an inorganic material, an insulating film containing carbon such as DLC or carbon nitride (CN), or an insulating film containing nitrogen such as silicon nitride (SiN) or silicon nitride oxide (SiNO or SiON) may be employed.

In such a state, the layer to be peeled includes the TFTs, the antenna and the protective film. That is, the layer to be peeled refers to a layer to be transposed, which is located over the peeling layer.

Below the layer to be peeled, an oxide film containing silicon is formed so as to contact the metal film as a peeling layer. Further, in order to prevent the intrusion of impurities or dust from the metal film or the substrate, an insulating film containing nitrogen (referred to as a nitrogen film) is preferably formed over the oxide film containing silicon such as a silicon nitride (SiN) film or a silicon nitride oxide (SiON or SiNO) film. The nitride film can function as a base film of the thin film transistors.

The oxide film containing silicon can be formed by sputtering or CVD using silicon oxide, silicon oxynitride and the like. Note that the oxide film containing silicon is preferably twice or more thicker than the metal film. According to the aforementioned conditions, in this embodiment, a silicon oxide film is formed to have a thickness of 150 to 200 nm by sputtering using a silicon target.

When forming the oxide film containing silicon, an oxide (metal oxide) 13 containing the metal is formed over the metal film. The metal oxide is formed to have a thickness of 0.1 nm to 1 μm, more preferably 0.1 to 100 nm, or further preferably 0.1 to 5 nm.

The metal oxide 13 may be a thin metal oxide which is formed over the surface of the metal film by treatment with an aqueous solution containing sulfuric acid, hydrochloric acid or nitric acid, a solution in which a hydrogen peroxide solution is mixed with sulfuric acid, hydrochloric acid or nitric acid, or ozone water. As an alternative method, the metal oxide may be formed by plasma treatment in an oxygen atmosphere, ultraviolet irradiation in an atmosphere containing oxygen by which ozone is generated, or heat treatment at 200 to 350° C. using a clean oven.

After forming the layer to be peeled 12 and the metal oxide 13 in this manner, heat treatment is performed to crystallize the metal oxide. For example, in the case of using W (tungsten) for the metal film, a metal oxide of $WO_x$ (0<x<3) is crystallized when heat treatment is performed at 400° C. or higher. The temperature or whether to perform the heat treatment may be determined by the metal film selected. In order to perform the peeling step easily, the metal oxide may be crystallized according to need.

In addition, the heat treatment may be combined with other heat treatment. As a result, the number of steps can be reduced. For example, it may be combined with the heat treatment for crystallizing the semiconductor films of the thin film transistors (TFTs) 36 and 37. Note that by combination with the heat treatment, there may be a case where hydrogen contained in the semiconductor films is diffused to change the valence of the metal oxide.

Figure 9B:
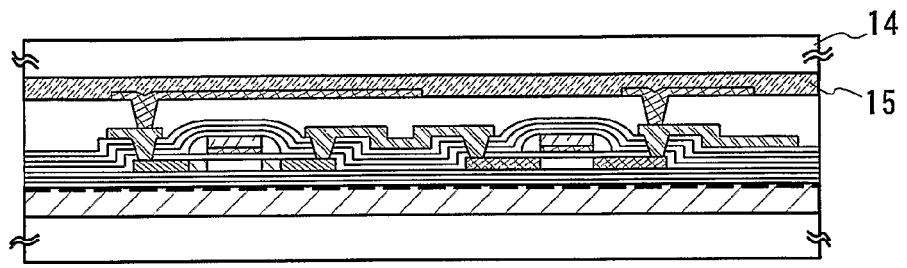

Then, as shown in FIG. 9B, the layer to be peeled 12 is attached to a supporting substrate 14 with a first adhesive 15. Note that the supporting substrate 14 is preferably a substrate which is harder than the first substrate 210. As the first adhesive 15, a peelable adhesive is preferably employed, for example such as an ultraviolet peelable adhesive which can be peeled off by an ultraviolet ray, a heat peelable adhesive which can be peeled off by heat, a water-soluble adhesive which can be peeled off by water, or a double-sided tape or the like. Note that in the case of using an adhesive epoxy resin or the like for the protective film covering the antenna, the first adhesive 15 is not required.

Figure 9C:
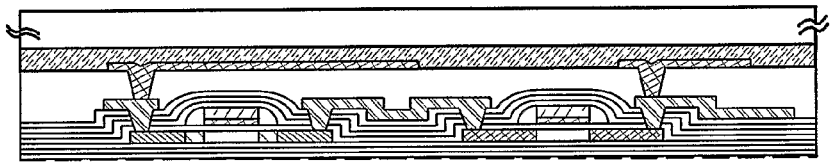

Then, the first substrate 210 provided with the peeling layer 11 is peeled off by physically applying pressure (hereinafter referred to as a physical method) (FIG. 9C).

Although not shown in the schematic view of FIG. 9C, the first substrate 210 is peeled off inside the layer of the metal oxide 13 or the boundary (interface) of an either side of the metal oxide 13. The boundary of the either side of the metal oxide 13 is the interface between the metal oxide 13 and the metal film or the interface between the metal oxide 13 and the layer to be peeled 12.

After attaching the supporting substrate 14, heat treatment may be performed to crystallize the metal oxide.

At this time, in order to perform the peeling easily, the first substrate 210 may be partially cut and the vicinity of the peeling interface at a cut surface, namely the interface between the metal film and the metal oxide 13 may be scratched with a cutter or the like.

Figure 9D:
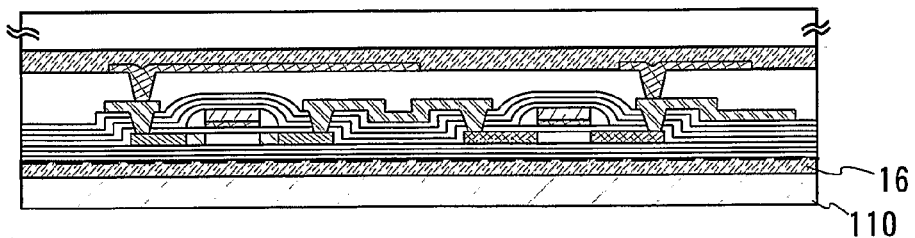

Subsequently, as shown in FIG. 9D, the layer to be peeled 12 which has been peeled is attached to a second substrate 110 with a second adhesive 16. The second adhesive 16 may be an ultraviolet curable resin, specifically an epoxy resin adhesive, an adhesive such as a resin additive, a double-sided tape or the like. In the case where the second substrate has an adhesion property, the second adhesive is not required.

Note that there may be a case where the metal oxide 13 is entirely removed, or a part of or most of the metal oxide 13 is scattered (remains) below the layer to be peeled 12. In the case where the metal oxide 13 remains, the layer to be peeled 12 may be attached to the second substrate after removing the residue by etching or the like. At this time, any of the insulating films provided below the semiconductor film may be removed.

The second substrate may be formed using plastic materials such as polyethylene terephthalate, polycarbonate, polyarylate or polyethersulfone. In addition, the second substrate may be processed with coating before transposing the layer to be peeled 12 thereto in order to reduce the irregularity of the surface and improve the hardness, resistance and stability.

The second substrate having such materials is referred to as a plastic substrate, which includes a plastic film. Such a plastic substrate is flexible; therefore, it is also called a flexible substrate.

Figure 9E:
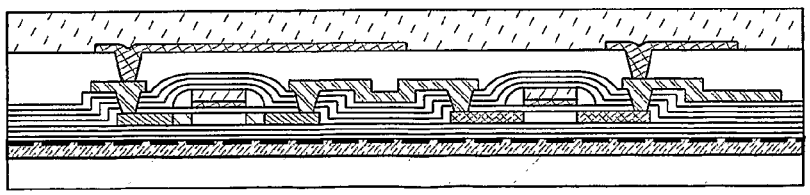

Then, the first adhesive 15 is removed and the supporting substrate 14 is peeled off (FIG. 9E). In order to peel off the first adhesive, it may be irradiated with an ultraviolet ray, heated, or rinsed.

Note that the removal of the first adhesive and hardening of the second adhesive may be carried out in one step. For example, in the case where the first adhesive and the second adhesive are formed of a heat peelable resin and a heat curable resin respectively, or an ultraviolet peelable resin and an ultraviolet curable resin respectively, the removal of the first adhesive and the hardening of the second adhesive can be carried out by heating or ultraviolet irradiation only once.

In this manner, a thin film integrated circuit fixed on a plastic substrate can be formed.

In comparison with an IC formed using a silicon wafer having a thickness of about 50 μm, the thin film integrated circuit of the invention is as thin as 10 to 200 nm because semiconductor films isolated in island shapes are used. As a result, the ID chip of the invention can be quite thin, flexible and light weight. Consequently, an ID chip which has excellent shock resistance and flexibility can be obtained.

Unlike an IC chip manufactured using a silicon wafer, back grind process which results in cracks or scars is not required to be performed, and variation in thickness can be suppressed to about several hundred nanometers at largest since it depends on the variation in deposition of semiconductor films and the like; therefore, the variation can be suppressed to a great extent as compared to the variation of several to several ten micrometers due to the back grind process.

In addition, a commercially available silicon substrate is circular and has a diameter of about 30 centimeters at longest. Therefore, it has been difficult to mass produce wireless chips to reduce the cost thereof. However, by forming a wireless chip using a glass substrate as in the invention, mass production of wireless chips can be enabled to reduce the cost thereof.

By using the SPOP method as set forth above, the first substrate can be reutilized, thereby the unit cost of a processor can be reduced.

The invention is not limited to the aforementioned peeling step, and the peeling layer may be irradiated with a laser beam or the glass substrate may be removed by etching. However, by using the peeling method as in this embodiment, design flexibility can be increased since the first substrate 210 is not required to transmit a laser beam.

In this embodiment, description is made on a thin film integrated circuit fixed on a plastic substrate; however, the invention is not limited to this. For example, after peeling the layer to be peeled 12 off the first substrate 210, the peeled layer may be transposed not to the second substrate 110 but to a film, which may be sealed then.

Embodiment 5

In this embodiment, description is made on a method for fixing an element forming region on a plastic substrate using a different method from the aforementioned embodiment.

Figure 10A:
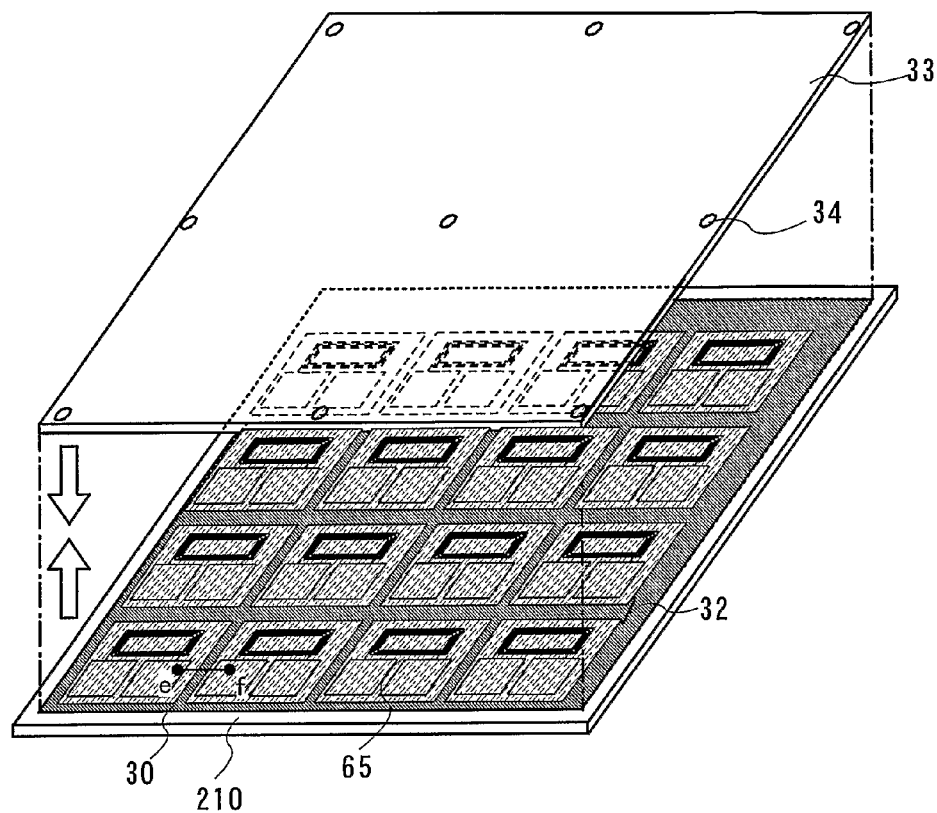
FIGS. 10A and 10B are diagrams showing a manufacturing method of a wireless chip of the invention.
Figure 10B:
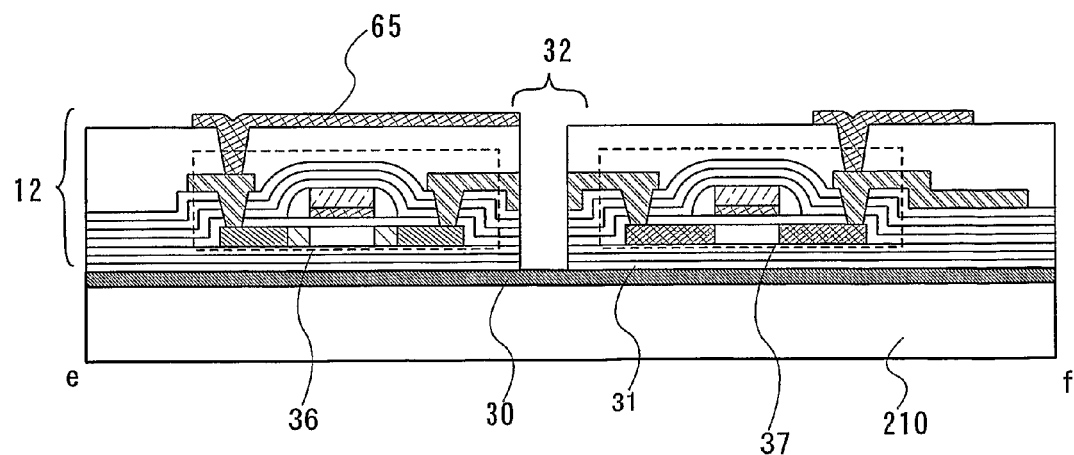

As shown in FIG. 10A, a peeling layer 30 and the layer to be peeled 12 are sequentially formed over the first substrate 210. FIG. 10B is a cross-sectional view along e-f of FIG. 10A, which typically illustrates n-type and p-type thin film transistors only.

The layer to be peeled 12 includes an antenna and elements which constitute the boosting power source circuit 103, the demodulation circuit 104, the modulation circuit 105, the memory interface (IF) 106 and the memory 107. As the circuit elements, the n-channel and p-channel thin film transistors (TFTs) 36 and 37 can be used. Note that the structure and the manufacturing method thereof are similar to Embodiment 4; therefore, the description thereof is omitted.

The peeling layer 30 can be formed using a film containing silicon or a metal film. In this embodiment, description is made on a case where a film containing silicon is used.

The state of a film containing silicon may be any of an amorphous semiconductor, a semi-amorphous semiconductor (also referred to as SAS) in which an amorphous state and a crystalline state are mixed and a crystalline semiconductor. Note that the SAS includes a micro-crystalline semiconductor in which crystal grains of 0.5 to 20 nm can be observed in an amorphous semiconductor. The peeling layer 30 can be formed by sputtering, plasma CVD or the like. The peeling layer 30 may have a thickness of 0.03 to 1 μm, and it can be 0.03 μm or less within the allowable range of thin film deposition by a deposition system of the peeling layer.

The peeling layer 30 containing silicon may be added elements such as phosphorus or boron. The elements may be activated by heating or the like. By adding such elements, the etching rate of the peeling layer 30 can be improved.

The layer to be peeled 12 has an insulating film 31 in a region in contact with the peeling layer 30. The insulating film 31 is provided so that the layer to be peeled 12 is not etched. The insulating film 31 may be formed to have a single-layer structure of an insulating film containing oxygen or nitrogen such as silicon oxide ($SiO_x$), silicon nitride ($SiN_x$), silicon oxynitride ($SiO_xN_y$) (x>y) or silicon nitride oxide ($SiN_xO_y$) (x>y) (x, y=1, 2, . . . ), or a stacked-layer structure of such insulating films. For example, in the case of using a three-layer structure, a first insulating film is formed of a silicon oxide film, a second insulating film is formed of a silicon oxynitride film, and a third insulating film is formed of a silicon oxide film. When considering the diffusion of impurities from the first substrate 210 and the like, the insulating film 31 is preferably formed using a silicon oxynitride film;

however, it is concerned that the silicon oxynitride film has low adhesion to the peeling layer 30 and the semiconductor films of the TFTs. Therefore, the insulating film 31 preferably has a three-layer structure including a silicon oxide film which has high adhesion to the peeling layer 30, the semiconductor film and the silicon oxynitride film. Note that the insulating film 31 can function as a base film of the thin film transistors.

In such a state, an opening (groove, hole or the like) 32 is formed to expose the peeling layer 30 at least in a region other than the thin film transistors (TFTs) 36 and 37. The supporting substrate 33 provided with a hole 34 is attached to the first substrate 210 with an adhesive (not shown) or the like. As the adhesive, a resin material can be used such as an ultraviolet curable resin or a heat curable resin as well as a double-sided tape or the like.

Figure 11A:
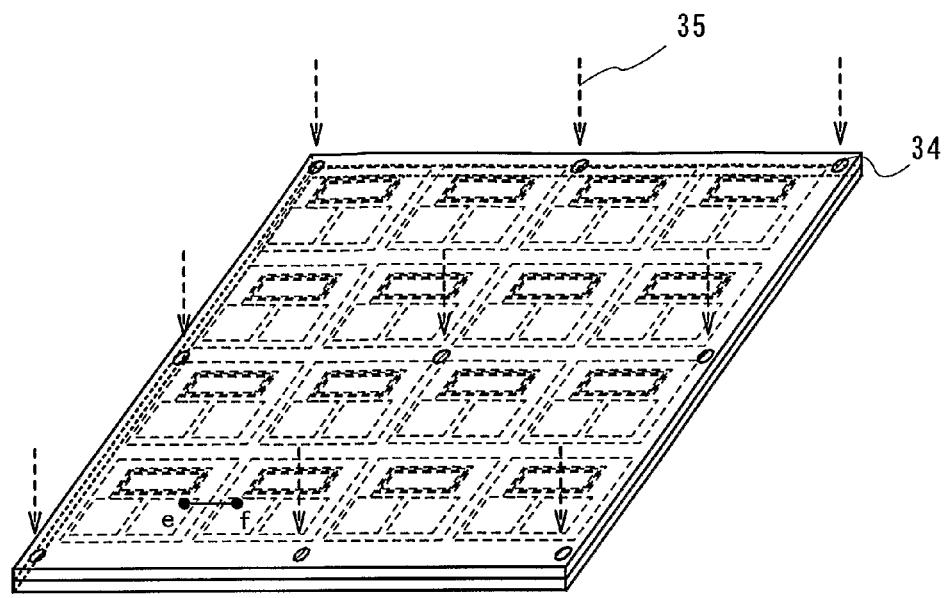
FIGS. 11A and 11B are diagrams showing a manufacturing method of a wireless chip of the invention.
Figure 11B:
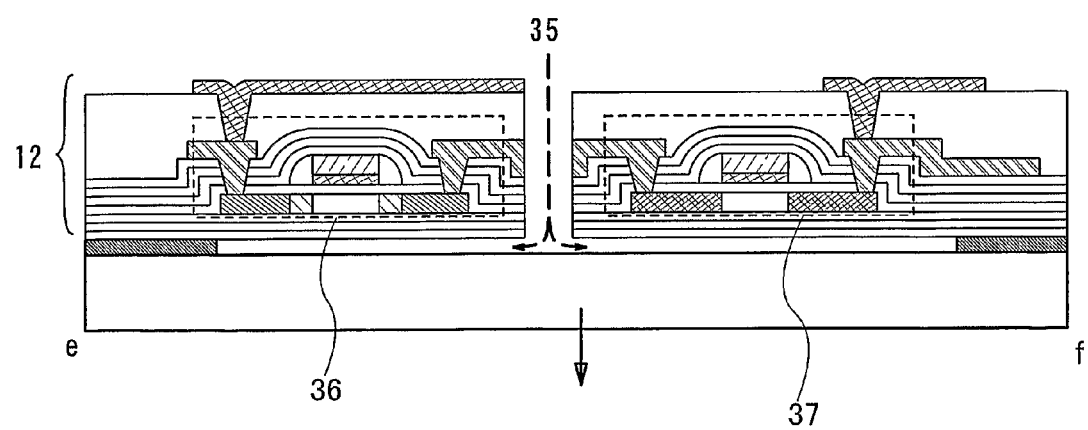

Then, as shown in FIG. 11A, an etchant 35 is injected into the opening 32 through the hole 34 to remove the peeling layer 30 by etching. FIG. 11B is a cross-sectional view along e-f of FIG. 11A.

As an etchant, a gas or a solution containing halogen fluoride can be used. For example, $ClF_3$ (chlorine trifluoride) can be used as the halogen fluoride. With such an etchant, the peeling layer 30 is selectively etched. More specifically, the peeling layer can be removed by using a low pressure CVD system with the conditions of the temperature at 350° C.; flow rate of $ClF_3$ at 300 sccm; atmospheric pressure at 6 Torr (6×133 Pa); and time of 3 hours. Alternatively, HF (hydrogen fluoride) can be used as a solution containing halogen fluoride.

In this manner, the peeling layer 30 can be removed to peel the layer 12 off the first substrate 210 so that the peeled layer is transposed to a plastic substrate using an adhesive or the like. Note that as the adhesive, a resin material can be used such as an ultraviolet curable resin or a heat curable resin as well as a double-sided tape or the like.

In the case of forming the thin film integrated circuit in this manner, the first substrate 210 can be reutilized, thereby the unit cost of an ID chip can be reduced.

The invention is not limited to the aforementioned peeling method, and the peeling layer may be irradiated with a laser beam or a glass substrate can be removed by etching. However, by using the peeling method as in this embodiment, design flexibility can be increased since the first substrate 210 is not required to transmit a laser beam.

This embodiment can be freely implemented in combination with the aforementioned embodiment modes and embodiments.

Embodiment 6

In this embodiment, description is made on the case where a metal film is used as the peeling layer 30 unlike the aforementioned embodiments.

In this embodiment, the metal which can be used as the peeling layer 30 includes a single layer of an element selected from W, Ti, Ta, Mo, Nd, Ni, Co, Zr, Zn, Ru, Rh, Pd, Os and Ir, or an alloy material or a compound material containing such element as a main component, or stacked layers thereof.

The metal film is formed by sputtering, plasma CVD or the like similarly to the metal film described in Embodiment 4.

Instead of the metal film, a nitrided metal film (metal nitride film) can be used, and further the metal film may be added nitrogen or oxygen similarly to the metal film described in Embodiment 4.

Over the peeling layer 30 containing metal, oxide, nitride or nitride oxide containing the metal is formed. Such oxide, nitride or nitride oxide containing the metal is also referred to as a reactant. For example, in the case of using W, Mo or a mixture of W and Mo for the metal film, the oxide, nitride or nitride oxide containing the metal corresponds to oxide, nitride or nitride oxide of W, Mo or the mixture of W and Mo.

Such a reactant can be manufactured when forming a film containing oxide, nitride or nitride oxide over the surface of the metal film.

In this embodiment, when forming a silicon oxide film over the peeling layer 30 containing W, an oxide film containing W, for example $WO_x$ (0<x<3) is formed over the surface of the peeling layer 30 containing W. Similarly, when forming a silicon nitride film over the peeling layer 30 containing W, a nitride film containing W can be formed, and when forming a silicon nitride oxide film over the peeling layer 30 containing W, a nitride oxide film containing W can be formed.

As an alternative manufacturing method of a reactant, oxide, nitride or nitride oxide can be formed over the metal film. For example, as a method for forming the oxide as a reactant, a similar method to the manufacturing method of a metal oxide described in Embodiment 4 can be used.

By selecting a metal film and a reactant formed in this manner, the etching rate of the peeling layer can be controlled.

The reactant formed over the surface of the metal film may have a chemical change of state due to heat treatment or the like in the subsequent step as shown in Embodiment 4. For example, in the case where an oxide film containing W is formed, the valence of the tungsten oxide ($WO_x$ (x=2 to 3)) changes.

Further, over the silicon oxide film or the like, an insulating film functioning as a base film of a thin film transistor is formed. The insulating film may be formed to have a single-layer structure of an insulating film containing oxygen or nitrogen such as silicon oxide ($SiO_x$), silicon nitride ($SiN_x$), silicon oxynitride ($SiO_xN_y$) (n>y) or silicon nitride oxide ($SiN_xO_y$) (x>y) (x, y=1, 2, . . . ), or a stacked-layer structure of such insulating films. By using such an insulating film, the diffusion of impurities from the first substrate 210 or the like can be reduced.

After that, a semiconductor film is formed and patterned into a predetermined shape to form island-like semiconductor films, thereby the thin film transistors (TFTs) 36 and 37 having the island-like semiconductor films can be formed. The structure and the manufacturing method of the thin film transistors are similar to those of Embodiment 4; therefore, description thereof is omitted.

Note that in order to form TFTs having a quite short gate length, the width of a conductive film is preferably shortened. For this, a step may be performed for thinning a mask provided to etch the conductive film, for example a resist mask. For example, a resist mask can be thinned using oxygen plasma. This step can be used in combination with the aforementioned embodiments.

The thin film transistor of the invention may be provided with sidewalls formed of insulating films on the side faces of a gate electrode. By using the sidewalls as masks, a high concentration impurity region can be formed. This structure can be used in combination with the aforementioned embodiments.

Then, an opening for forming a conductive film functioning as a wiring or an antenna is formed. Then, an insulating film functioning as a protective film may be formed. The insulating film functioning as a protective film preferably contains nitrogen. In addition, as the protective film provided over the antenna, an epoxy resin is preferably used.

In such a state, an opening (groove, hole or the like) is formed to expose the peeling layer 30 in a region other than the region where the thin film transistors are formed similarly to Embodiment 5. In this embodiment, an opening is formed between thin film integrated circuits.

Then, the supporting substrate 33 provided with the hole 34 is attached to the first substrate 210 with an adhesive or the like so as to overlap the opening. As the adhesive, a resin material can be used such as an ultraviolet curable rein or a heat curable rein as well as a double-sided tape or the like.

Then, the etchant 35 is injected into the opening 32 through the hole 34, thereby the peeling layer 30 can be removed. The peeling layer in this embodiment is a metal film and a reactant formed over the insulating substrate, and by removing these, the first substrate 210 can be peeled off. Note that in the case of using a metal film as the peeling layer, the first substrate 210 can be peeled off when at least one of the metal film and the reactant reacts with the etchant.

As the etchant, similarly to Embodiment 5, a gas or a solution containing halogen fluoride can be used. For example, $ClF_3$ (chlorine trifluoride) can be used as the halogen fluoride. In particular, in the case where the peeling layer is formed of W and $WO_3$ as an oxide thereof, it reacts with $ClF_3$ at fast speed, and thus can be removed in shorter time. When the peeling layer is chemically removed using an etchant, the residue of reactant can be preferably reduced. As an alternative solution containing halogen fluoride, hydrogen fluoride (HF) can be used, for example.

In addition to the method for chemically removing the peeling layer as set forth above, a physical method with pressure can be used as well. As a result, the peeling layer can be removed more easily and in shorter time.

In this manner, the peeling layer 30 can be removed to peel the layer 12 off the first substrate 210 so that the thin film integrated circuit is fixed on a supporting substrate such as a plastic substrate or a plastic film substrate using an adhesive or the like. Note that as the adhesive, a resin material can be used such as an ultraviolet curable resin or a heat curable resin as well as a double-sided tape or the like.

In the case of forming the thin film integrated circuit in this manner, the first substrate 210 can be reutilized, thereby the unit cost of an ID chip can be reduced.

The invention is not limited to the aforementioned peeling method, and the peeling layer may be irradiated with a laser beam or a glass substrate can be removed by etching. However, by using the peeling method as in this embodiment, design flexibility can be increased since the first substrate 210 is not required to transmit a laser beam.

This embodiment can be freely implemented in combination with the aforementioned embodiment modes and embodiments.

Embodiment 7

In this embodiment, description is made on a case where a thin film integrated circuit and an antenna which is separately formed are connected.

Figure 14:
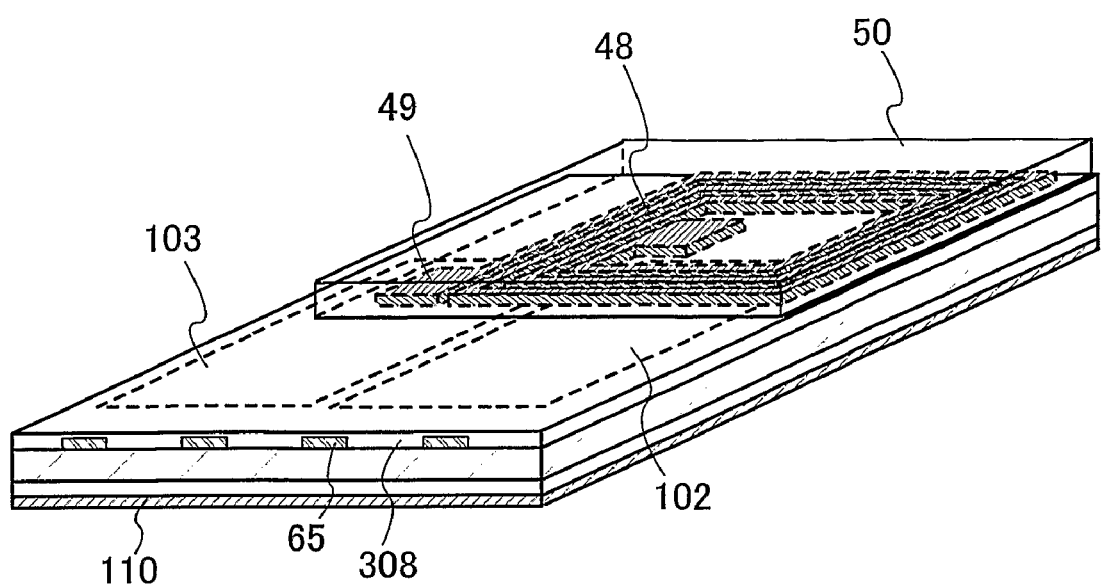
FIG. 14 is a perspective view of an antenna of a wireless chip of the invention.

As described in the aforementioned embodiments, an antenna can be formed by photolithography using the conductive film 65; however, in this embodiment, an antenna 48 is formed over another substrate 50 and connected to the conductive film 65 through a bump 49 as shown in FIG. 14. The antenna 48 can be manufactured by any of a printing method, a droplet discharge method, a sputtering method, a photolithography method, a vapor deposition method using a metal mask, or by combination thereof. Further, a conductive film may be stacked thereover by a plating method to reduce the resistance of the antenna. In the case of forming the antenna by the droplet discharge method or the printing method, the conductive film is not required to be patterned; therefore, the number of manufacturing steps can be preferably reduced.

The antenna can be formed by using a conductive material such as Ag (silver), Al (aluminum), Au (gold), Cu (copper) or Pt (platinum). In the case where wiring resistance of such material is concerned, the wiring resistance can be reduced by thickening the antenna by a plating method. In addition, since the antenna is formed over another substrate, the wiring resistance can be reduced if the width of the antenna is increased. As for the material such as Cu having low resistance but the diffusion thereof is concerned, an insulating film containing nitrogen is preferably formed over the surface of the antenna forming region or by covering the periphery of the antenna.

In the case of the droplet discharge method, Ag which is mixed as a solvent into tetradecane can be dropped from a nozzle to form the antenna. At this time, in order to increase the adhesion of Ag, a base film formed of titanium oxide ($TiO_x$) may be formed over the antenna substrate.

Note that the shape and the position of the antenna are not limited to those in FIG. 14. For example, the antenna may be formed over the whole ID chip as shown in the layout of FIG. 8.

Alternatively, the planarity of the antenna 48 formed over another substrate may be improved by applying pressure thereto. As a result, the antenna 48 can have a thinner shape. In addition to the application of pressure, heat treatment may be applied, and the application or pressure and the heat treatment may be carried out at the same time. In the case of using the droplet discharge method, if there is a need to perform heat treatment to remove a solvent, the application of pressure and the heat treatment are preferably carried out at the same time.

By mounting the antenna formed in this manner, an ID chip can be obtained.

After that, a protective film may be formed so as to cover the another substrate and the antenna. The protective film is preferably formed of an organic material such as an epoxy resin, for example. The protective film has a thickness of 15 to 30 μm.

The thin film integrated circuit can be peeled off by using any of the peeling methods in the aforementioned embodiments.

This embodiment can be freely implemented in combination with the aforementioned embodiment modes and embodiments.

Embodiment 8

In this embodiment, description is made on the timing of peeling a thin film integrated circuit having a boosting power source circuit.

After forming a conductive layer functioning as an antenna (simply referred to as an antenna), the thin film integrated circuit can be peeled off at any of the following 4 timings.

According to the first peeling timing, an opening is formed by etching an insulating film and the like so as to expose a peeling layer; a protective film is formed covering an antenna; and then an etchant is injected into the opening to remove the peeling layer, thereby peeling the thin film integrated circuit off the substrate.

According to the second timing, a protective film is formed covering an antenna; an opening is formed by etching an insulating film and the like so as to expose a peeling layer; and then an etchant is injected into the opening to remove the peeling layer, thereby peeling the thin film integrated circuit off the substrate.

According to the third timing, an opening is formed by etching an insulating film and the like so as to expose a peeling layer; a protective film is formed covering an antenna; and then an etchant is injected into the opening to selectively remove the peeling layer, thereby peeling the thin film integrated circuit off the substrate by a physical method.

According to the fourth timing, a protective film is formed covering an antenna; an opening is formed by etching an insulating film and the like so as to expose a peeling layer; and then an etchant is injected into the opening to selectively remove the peeling layer, thereby peeling the thin film integrated circuit off the substrate by a physical method.

By applying the physical method, the peeling can be carried out more easily and in shorter time.

This embodiment can be freely implemented in combination with the aforementioned embodiment modes and embodiments.

Embodiment 9

In this embodiment, description is made on a structure and a manufacturing method of a TFT which constitutes a thin film integrated circuit.

Figure 17A:
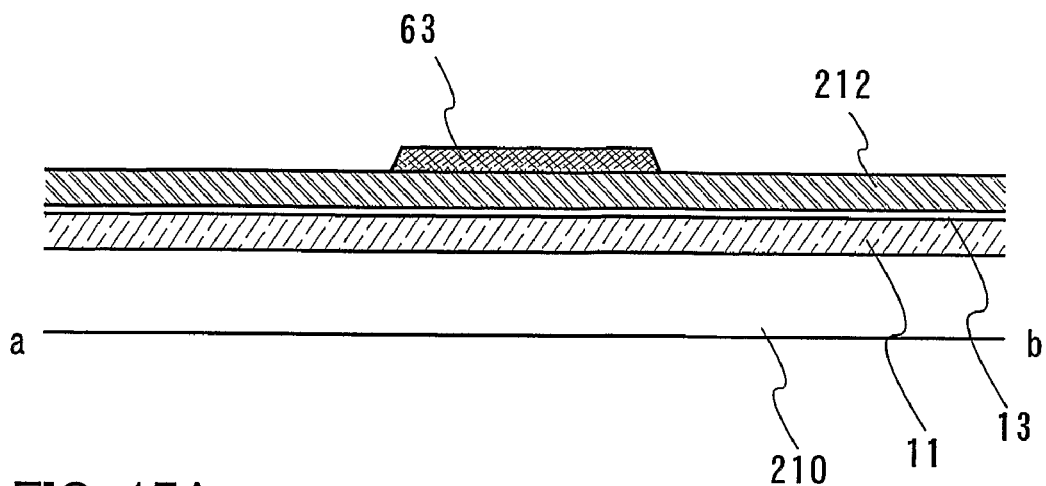
FIGS. 17A and 17B are manufacture diagrams of a thin film transistor constituting a wireless chip of the invention.

As shown in FIG. 17A, the peeling layer 11 is formed over the first substrate 210. In this embodiment, a metal film is used as the peeling layer 11, and the metal oxide 13 containing the metal and a silicon oxide film 212 are formed in this order. When forming the silicon oxide film 212, in the case of using W as the metal film, the metal oxide ($WO_x$ ($0<x<3$)) 13 containing W is formed.

After that, a conductive film functioning as a bottom gate electrode (hereinafter referred to as a bottom gate electrode 63) is formed. The bottom gate electrode 63 can be formed by using a metal or a polycrystalline semiconductor to which impurities having one conductivity type are added. When using a metal, tungsten (W), molybdenum (Mo), titanium (Ti), tantalum (Ta), aluminum (Al) or the like can be used. The bottom gate electrode 63 is etched into a desired shape using a mask, for example, a resist mask. At this time, etching may be performed after thinning the resist mask using oxygen plasma in order to form a fine gate electrode.

Figure 17B:
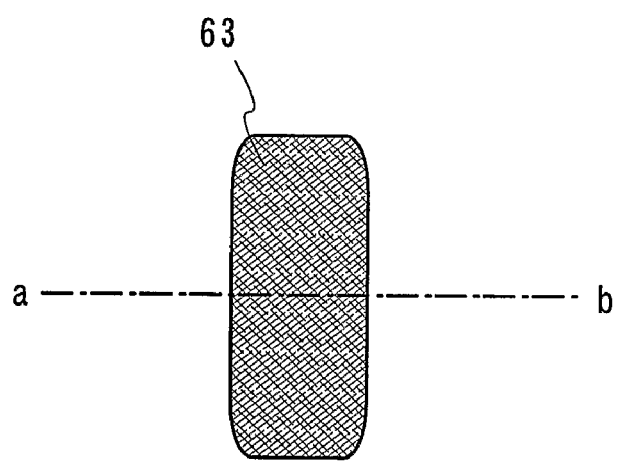

FIG. 17B is a top view of the bottom gate electrode 63, and FIG. 17A corresponds to a cross-sectional view along a-b of FIG. 17B.

Figure 18A:
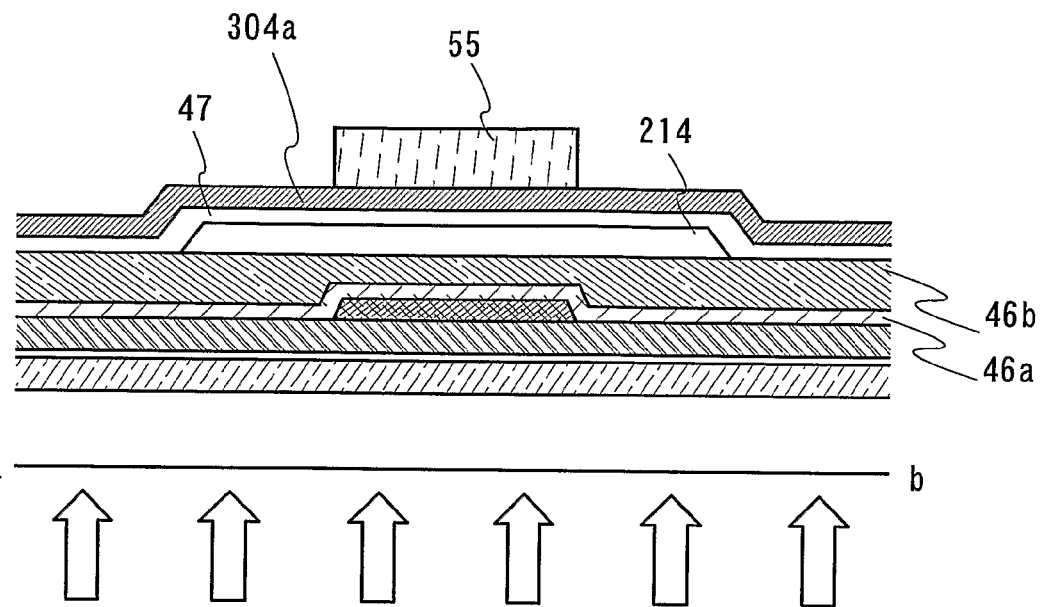
FIGS. 18A and 18B are manufacture diagrams of a thin film transistor constituting a wireless chip of the invention.

Then, as shown in FIG. 18A, an insulating film 46 functioning as a base film is formed. In this embodiment, a silicon nitride film 46a is formed as a first insulating film while a silicon oxynitride film 46b is formed as a second insulating film; however, the invention is not limited to this stacking order.

Then, a semiconductor film 214 having a predetermined shape, a gate insulating film 47 covering the semiconductor film, and a conductive film 304a functioning as a gate electrode are formed in this order. The semiconductor film may be formed by using an amorphous semiconductor film, a crystalline semiconductor film, an SAS or a microcrystalline semiconductor film. The crystalline semiconductor film can be formed by applying heat treatment to an amorphous silicon film. The heat treatment may be performed by using a heating furnace or laser irradiation. In order to decrease the temperature of the heat treatment, the amorphous semiconductor film may be coated with metal elements for promoting crystallization, typically nickel (Ni). As a result, a crystalline semiconductor film having uniform orientation can be obtained. In the case of performing the laser irradiation, a CW laser system or a pulse laser system can be employed. Further, the CW laser and the pulse laser may be combined for irradiation. Alternatively, after crystallizing the semiconductor film with a heating furnace, it may further be irradiated with laser to increase the crystallinity thereof. The semiconductor film can be formed by using silicon, germanium or a mixture of them.

In order to pattern the conductive film 304a into a predetermine shape, a mask, for example a resist mask is formed. At this time, a resist mask 55 having a predetermined shape can be formed by back-surface exposure using the bottom gate electrode 63. Then, the conductive film 304a is patterned into a predetermined shape by using the resist mask 55, thereby forming the lower-layer electrodes 18 and 20 of the gate electrode.

Figure 18B:
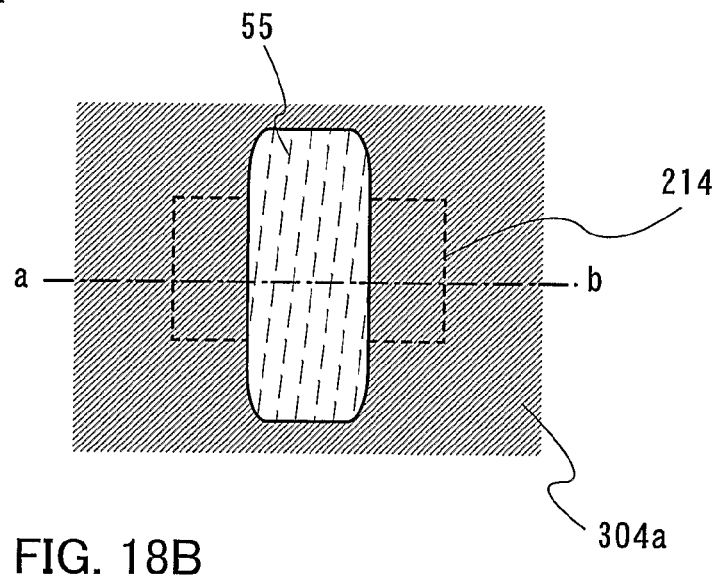

FIG. 18B is a top view where a resist mask is provided on the conductive film 304a, and FIG. 18A corresponds to a cross-sectional view along a-b of FIG. 18B.

Figure 19A:
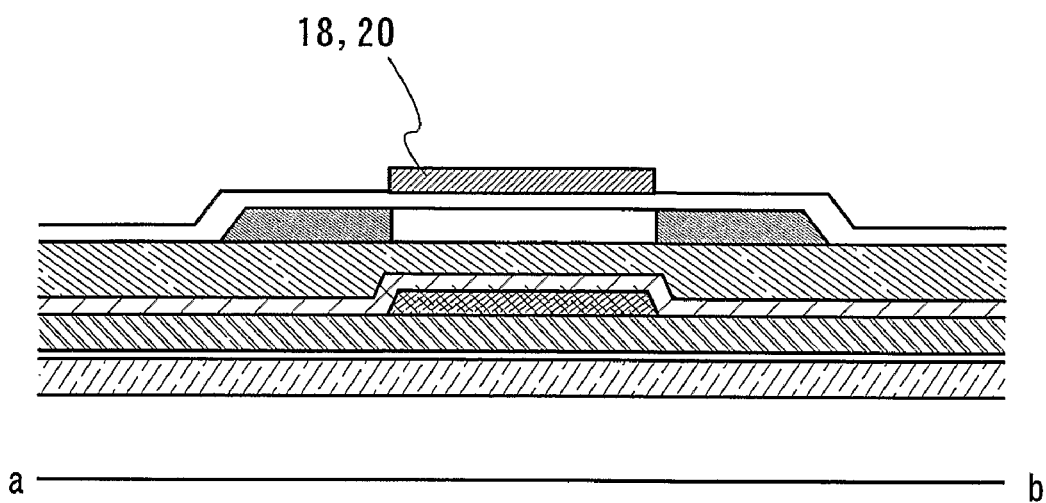
FIGS. 19A and 19B are manufacture diagrams of a thin film transistor constituting a wireless chip of the invention.

Then, as shown in FIG. 19A, impurity elements are added to the semiconductor film 214 by using the lower-layer electrodes 18 and 20.

Then, in order to separately control the bottom gate electrode 63 and the lower-layer electrodes 18 and 20, a wiring is connected to each of the bottom gate electrode 63 and the lower-layer electrodes 18 and 20. In order to provide a contact hole for connecting the bottom gate electrode 63 and the wiring, the lower-layer electrodes 18 and 20 are partially removed. At this time, the lower-layer electrodes 18 and 20 may be partially etched by providing a mask, for example, a resist mask on the lower-layer electrodes 18 and 20.

Figure 19B:
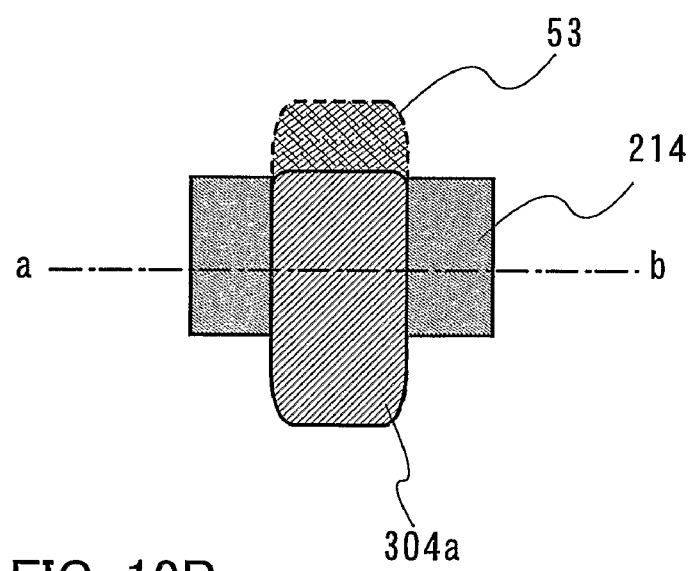

FIG. 19B is a top view of the lower-layer electrodes 18 and 20 which are partially etched, and FIG. 19A corresponds to a cross-sectional view along a-b of FIG. 19B.

In the case of controlling the bottom gate electrode 63 similarly to the lower-layer electrodes 18 and 20, the conductive film is not required to be partially removed unlike the aforementioned. Then, by forming contact holes in the gate insulating film 47 provided over the bottom gate electrode 63, and directly forming the lower-layer electrodes 18 and 20 in the contact holes, the bottom gate electrode 63 can be connected to the lower-layer electrodes 18 and 20.

Figure 20A:
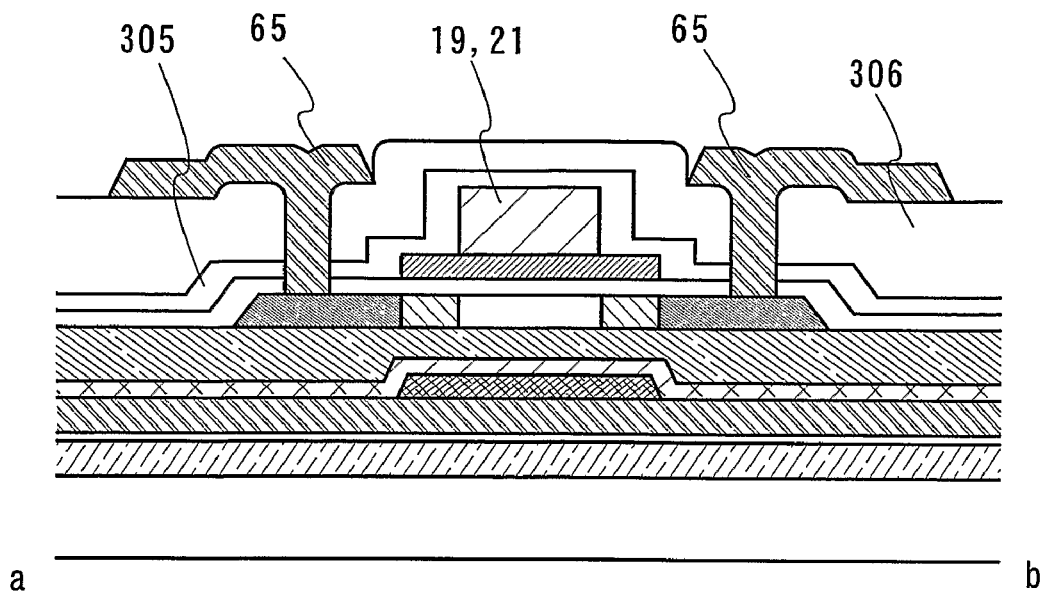
FIGS. 20A and 20B are manufacture diagrams of a thin film transistor constituting a wireless chip of the invention.

Then, as shown in FIG. 20A, the upper-layer electrodes 19 and 21 may be formed so as to form a gate electrode having a stacked-layer structure. In this embodiment, the upper-layer electrodes 19 and 21 can be patterned into predetermined shapes by using a mask, for example, a resist mask. Then, impurity elements may be added with the upper-layer electrodes 19 and 21 being provided. At this time, low concentration impurity regions can be formed so as to overlap the lower-layer electrodes 18 and 20 respectively.

After that, an insulating film 305 is formed covering the gate electrode. The insulating film 305 can be formed by using an insulating film containing oxygen or nitrogen such as silicon oxide ($SiO_x$), silicon nitride ($SiN_x$), silicon oxynitride ($SiO_xN_y$) (x>y) or silicon nitride oxide ($SiN_xO_y$) (x>y) (x, y=1, 2, . . . ). In this embodiment, silicon oxynitride is employed. When the insulating film 305 is formed by plasma CVD, in particular, it can contain more hydrogen. With such hydrogen, dangling bonds of the semiconductor film 214 can be preferably reduced. Therefore, heat treatment is preferably applied with the insulating film 305 being provided.

Then, an interlayer insulating film 306 is formed covering the insulating film 305 so as to improve the planarity thereof. Such an interlayer insulating film can be formed by using an organic material or an inorganic material, and specifically, Embodiment 4 can be referred to.

Note that the heat treatment after the formation of the insulating film 305 may be performed after forming the interlayer insulating film 306.

After that, contact holes are formed in the interlayer insulating film 306, the insulating film 305 and the gate insulating film 47, and the conductive film 65 functioning as a wiring connected to the impurity region is formed. By using the conductive film 65, an antenna can be formed.

Figure 20B:
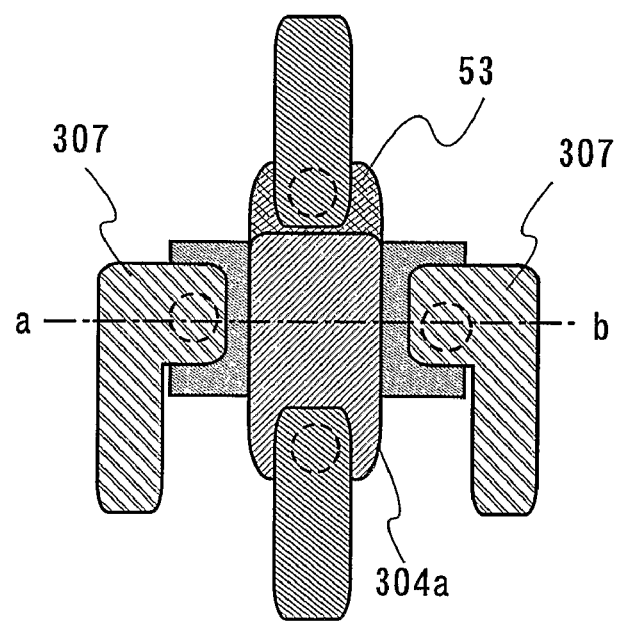

FIG. 20B is a top view where the conductive film 65 as a wiring, the wiring connected to the bottom gate electrode 63 and the wiring connected to the gate electrode are provided, and FIG. 20A corresponds to a cross-sectional view along a-b of FIG. 20B. Note that the upper-layer electrodes 19 and 21 are not shown.

In this manner, a TFT having the bottom gate electrode 63 can be formed. The bottom gate electrode 63 can be controlled separately from the gate electrode. Therefore, in forming a fine TFT, even if a current flows when an off signal is inputted to a gate electrode, the TFT can be accurately turned off by controlling the bottom gate electrode 63. As a result, low power consumption can be achieved.

Specifically, when a negative bias voltage is applied to the bottom gate electrode 63 of the n-channel thin film transistor (TFT) 36, the threshold voltage thereof can be increased to reduce the leak current. When a positive bias voltage is applied thereto, on the other hand, the threshold voltage can be lowered to make a current flow in the channel forming region easily. Accordingly, the thin film can operate at faster speed or with a lower voltage.

This embodiment can be freely implemented in combination with the aforementioned embodiment modes and embodiments.

Embodiment 9

In this embodiment, description is made on a structure of a TFT which is different from the aforementioned embodiments.

Figure 12:
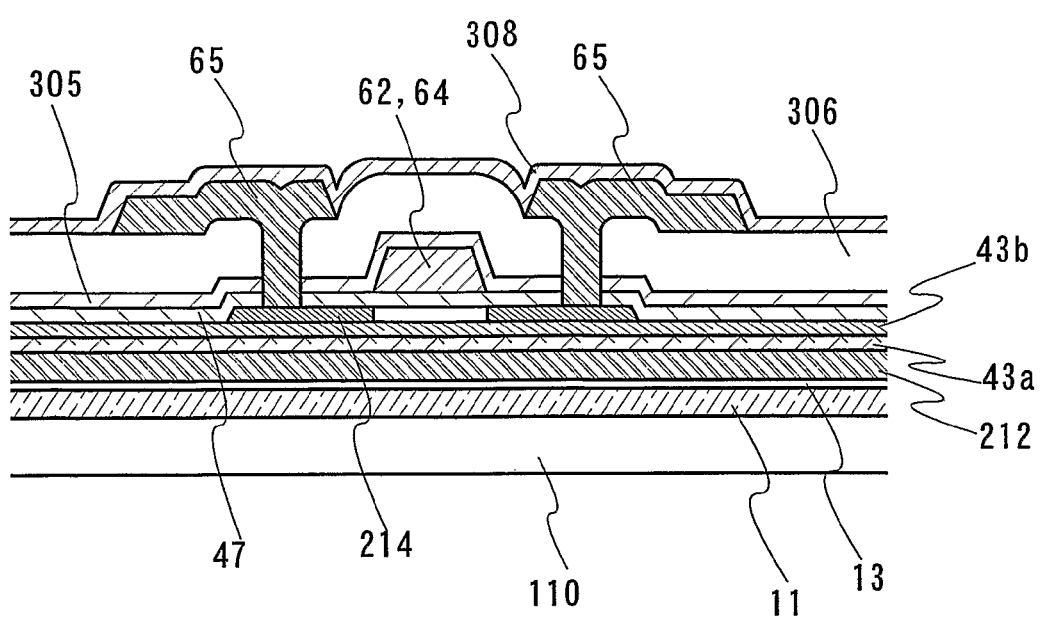
FIG. 12 is a cross-sectional diagram of a thin film transistor constituting a wireless chip of the invention.

FIG. 12 is an example in which a top-gate TFT is adopted. Over the first substrate 210, the peeling layer 11 and the insulating film 13 are formed in this order, over which a thin film transistor is provided. At least the insulating film 43 (43$a$ and 43$b$) functions as a base film of the semiconductor film 214. In addition, the gate insulating film 47 is provided covering the semiconductor film 214. Over the gate insulating film 47, the gate electrodes 62 and 64 are formed correspondingly to the semiconductor film 214, over which the insulating film 305 functioning as a protective film and the interlayer insulating film 306 are provided. Over the interlayer insulating film 306, an insulating film 308 functioning as a protective layer may be further formed.

As for the material and the manufacturing method of the semiconductor film 214, Embodiment 9 may be referred to.

The peeling layer 11 and an etching method thereof can follow any of those shown in Embodiments 4 to 6.

The gate electrodes 62 and 64 can be formed using a polycrystalline semiconductor to which impurities having one conductivity type are added. In the case of forming the gate electrodes to have a stacked-layer structure, a so-called hat shape may be employed in which an edge of the first layer is formed larger than an edge of the second layer. At this time, by forming the first layer using a metal nitride, barrier property can be increased. In such a case, it can be prevented that impurities are diffused to the gate insulating film 47 and the semiconductor film 214 thereunder by the metal of the second layer.

A transistor formed by combining the semiconductor film 214, the gate insulating film 47, the gate electrodes 62 and 64 and the like can employ various structures such as a single-drain structure, an LDD structure and a gate overlapped drain (GOLD) structure. Further, the invention can adopt a single-gate structure or a multi-gate structure. The multi-gate structure is equivalent to a structure where transistors each having the same level of gate voltage are connected in series.

The interlayer insulating film 306 can be formed by using an inorganic insulating material such as silicon oxide or silicon oxynitride or an organic insulating material such as an acrylic resin or a polyimide resin. In the case of using an application method such as spin coating or roll coating, silicon oxide formed by heat treatment can be employed after applying an insulating film material solved in an organic solvent. For example, after forming a film having a siloxane bond, an insulating film which can be formed by heat treatment at 200 to 400° C. can be used. When an insulating film formed by an application method is used as the interlayer insulating film 306, the surface thereof can be planarized. In addition, the insulating film can be planarized by reflowing. In this manner, when a wiring is formed over the planarized insulating film, breaking of the wiring can be prevented. Further, the invention can be effectively applied to the case of forming a multi-layer wiring.

Over the interlayer insulating film 306, the conductive film 65 functioning as a wiring is formed. The conductive film is preferably formed by combining a low-resistant material such as aluminum (Al) and a high-melting-point metal material such as titanium (Ti) or molybdenum (Mo), for example a stacked-layer structure of titanium (Ti) and aluminum (Al) or a stacked-layer structure of molybdenum (Mo) and aluminum (Al). In addition, an antenna can be formed by using the conductive film 65.

A TFT having such a structure can be applied to a thin film integrated circuit.

Figure 13:
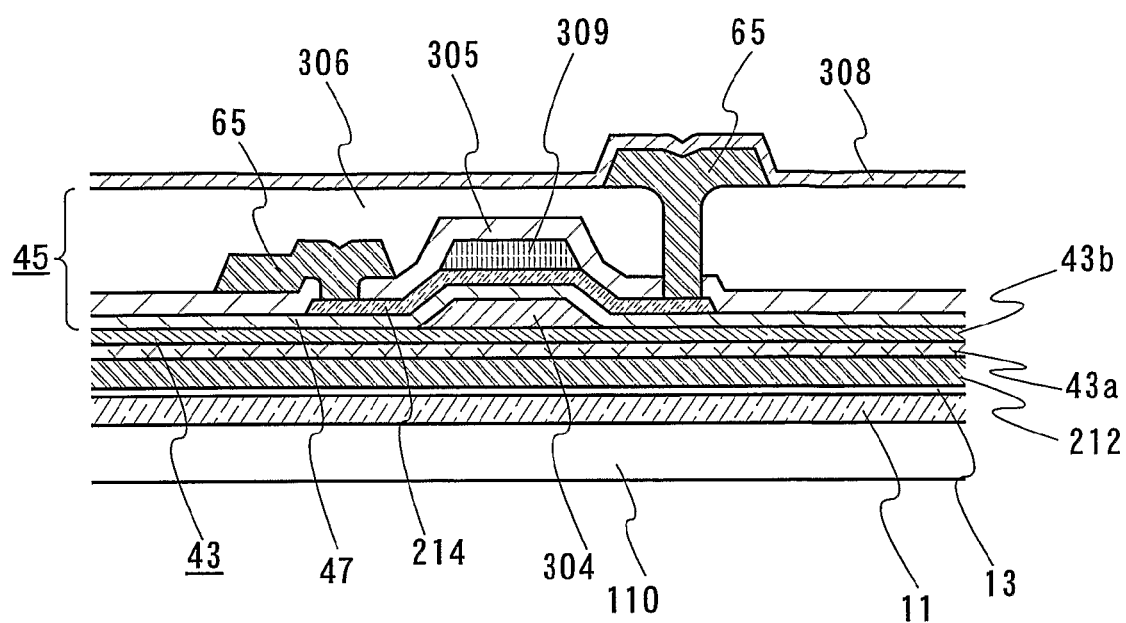
FIG. 13 is a cross-sectional diagram of a thin film transistor constituting a wireless chip of the invention.

FIG. 13 shows an example where a bottom-gate TFT is adopted. Over the substrate 110, the peeling layer 11 and the insulating film 13 are formed in this order, over which an element forming layer 45 is provided. The element forming layer 45 includes a gate electrode 304, the gate insulating film 47, the semiconductor film 214, a channel protecting layer 309, the insulating film 305 functioning as a protective layer and the interlayer insulating film 306 functioning as an inter-layer insulating layer. Over the element forming layer 45, the insulating film 308 functioning as a protective layer may be formed. The insulating film 308 can be formed to have a single-layer structure of an insulating film containing oxygen or nitrogen such as silicon oxide ($SiO_x$), silicon nitride ($SiN_x$), silicon oxynitride ($SiO_xN_y$) (x>y) or silicon nitride oxide ($SiN_xO_y$) (x>y) (x, y=1, 2, ...), or a stacked-layer structure of such insulating films.

The conductive film 65 can be formed over the insulating film 305 or the interlayer insulating film 306. By using the conductive film 65, an antenna can be formed.

A TFT having such a structure can be applied to a thin film integrated circuit.

In this manner, a thin film transistor used in a thin film integrated circuit may have a top-gate structure, a bottom-gate structure or a dual-gate structure shown in Embodiment 9. The top-gate structure, the bottom-gate structure and the dual-gate structure may be used in combination as well. That is, the invention is not limited to the structure of the thin film transistor.

This embodiment can be freely implemented in combination with the aforementioned embodiment modes and embodiments.

Embodiment 10

In this embodiment, description is made on a cross-sectional view of a sealed ID chip.

An ID chip is supplied with power from an antenna, and it is thus difficult to obtain a stable power source, and power consumption is required to be suppressed as much as possible. If the power consumption is increased, electromagnetic waves are required to be inputted; therefore, such problems arise that the power consumption of a reader/writer is increased, other devices or human bodies are adversely affected or communication distance between the ID chip and the reader/writer is restricted.

Therefore, in this embodiment, in order to suppress the power consumption, a thin film transistor having a dual-gate structure shown in Embodiment 9 is employed to form a thin film integrated circuit 52 typified by a boosting power source circuit.

Figure 15:
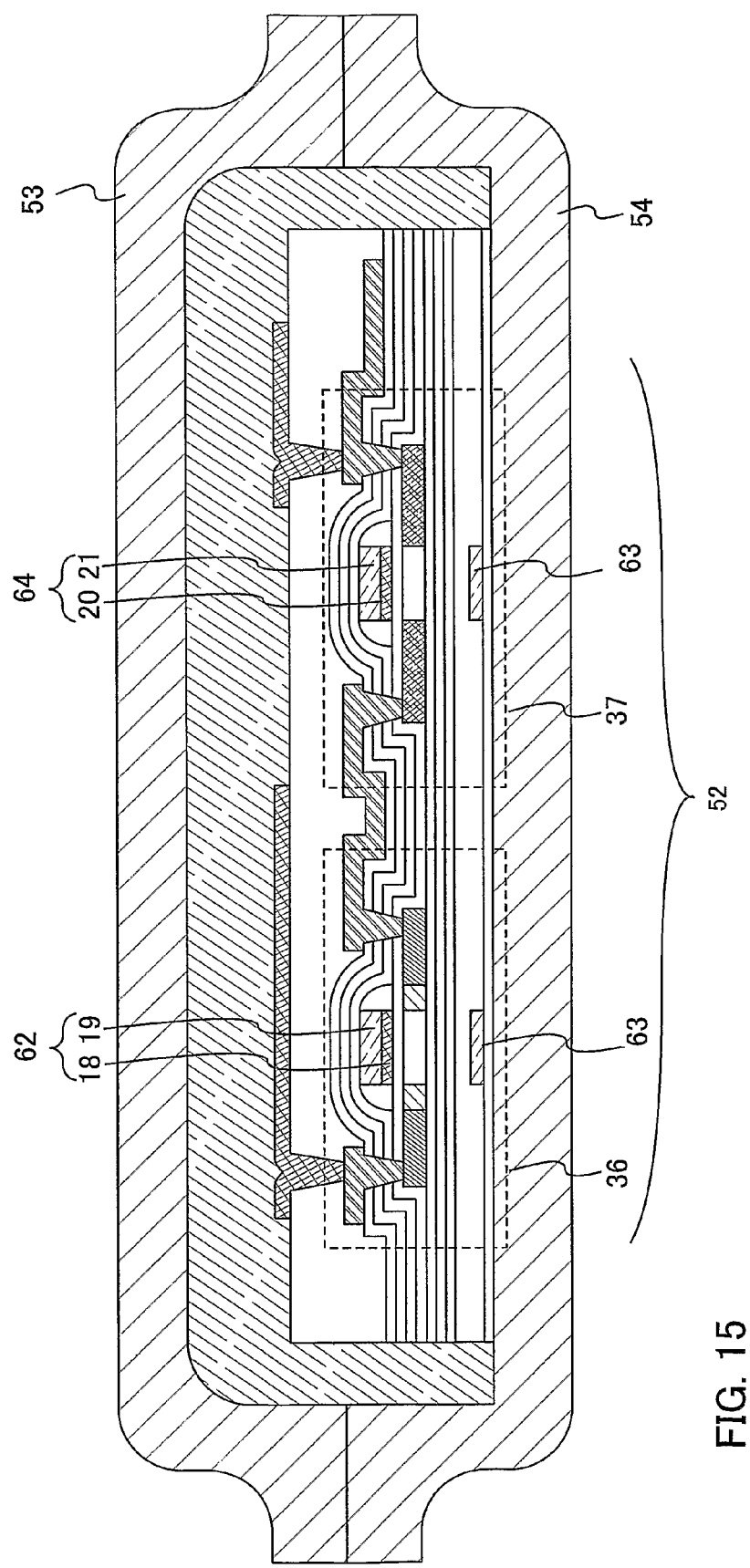
FIG. 15 is a cross-sectional view of a wireless chip of the invention.

FIG. 15 shows the n-channel thin film transistor (TFT) 36 including the bottom gate electrode 63 and the top gate electrode 62, and the p-channel thin film transistor 37 including the bottom gate electrode 63 and the top gate electrode 64.

The thin film integrated circuit 52 typified by the boosting power source circuit is sealed with a first substrate 53 and a second substrate 54. Thus, an ID chip having the thin film integrated circuit 52 sealed with the first substrate 53 and the second substrate 54 is completed.

In such an ID chip, a method for applying a bias voltage to the bottom gate electrode 63 is effective in suppressing the power consumption. Specifically, when a negative bias voltage is applied to the bottom gate electrode 63 of the n-channel thin film transistor (TFT) 36, the threshold voltage thereof can be increased to reduce the leak current. On the other hand, when a positive bias voltage is applied thereto, the threshold voltage thereof can be lowered to make a current flow easily in the channel forming region. Thus, the thin film transistor (TFT) 36 can operate at faster speed or with low voltage.

When a positive bias voltage is applied to the bottom gate electrode 63 of the p-channel thin film transistor (TFT) 37, the threshold voltage thereof can be increased to reduce the leak current. On the other hand, when a negative bias voltage is applied thereto, the threshold voltage thereof can be lowered to make a current flow easily in the channel forming region. Thus, the thin film transistor (TFT) 37 can operate at faster speed or with low voltage.

As set forth above, by controlling a bias voltage applied to the bottom gate electrode, the threshold voltage of the thin film transistors (TFTs) 36 and 37 can be changed to reduce the off current. As a result, the power consumption of the ID chip itself can be suppressed. Thus, even when a complex process such as encoding is performed, stable power can be supplied. In addition, as there is no need to input an electromagnetic wave, communication distance between the ID chip and a reader/writer can be improved. Note that application of a bias voltage is preferably switched with a dedicated control driver in accordance with the state of power via an antenna.

Figure 16:
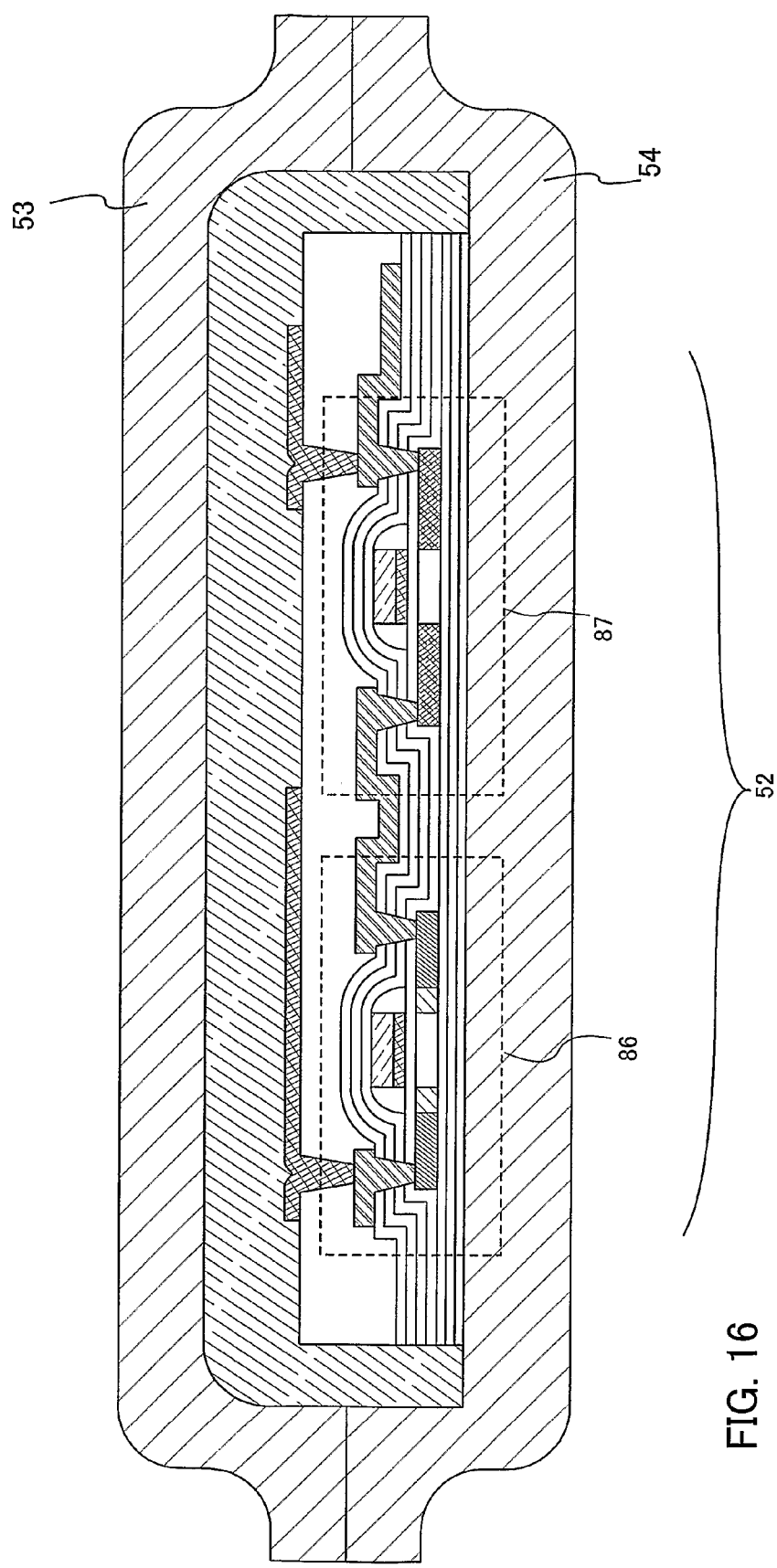
FIG. 16 is a cross-sectional view of a wireless chip of the invention.

Note that description is made in this embodiment on the case where a thin film transistor having a dual-gate structure is used; however, a thin film transistor having a single-gate structure may be employed as shown in FIG. 16. FIG. 16 shows an n-channel thin film transistor 86 and a p-channel thin film transistor 87 each having a single-gate structure.

Note that in FIG. 16, a total thickness of the thin film transistors, an antenna and a protective layer is 20 to 40 μm while the respective thickness of the first substrate 53 and the second substrate 54 is 15 to 35 μm.

This embodiment can be implemented in combination with the aforementioned embodiment modes and embodiments.

Embodiment 11

An ID chip manufactured in accordance with the invention has a wide range of application, and can be mounted on various objects. For example, the ID chip can be attached to bills, coins, securities, bearer bonds, certificates (e.g., driver's certificate or residence certificate: see FIG. 21A), packaging containers (e.g., package paper or bottle: see FIG. 21B), recording mediums (e.g., DVD software or video tape: see FIG. 21C), vehicles (e.g., bicycle or the like: see FIG. 21D), clothing accessories (e.g., bag or glasses: see FIG. 21E), food, clothes, daily commodities, electronic appliances and the like. The electronic appliance refers to a liquid crystal display device, an EL display device, a television set (also simply called a television or a television receiver), a portable phone and the like.

The ID chip is fixed on an object by being attached to the surface of an object or embedded into an object. For example, it is embedded in thick paper of a book, or embedded into an organic resin of a package. Further, it is attached to the surface of bills, coins, securities, bearer bonds, certificates and the like, or embedded therein. By providing the ID chip in the aforementioned objects, for example, in packaging containers, recording mediums, personal belongings, food, clothes, daily commodities, electronic appliances and the like, efficiency of an inspection system or a system in a rental shop can be improved.

Figure 22B:
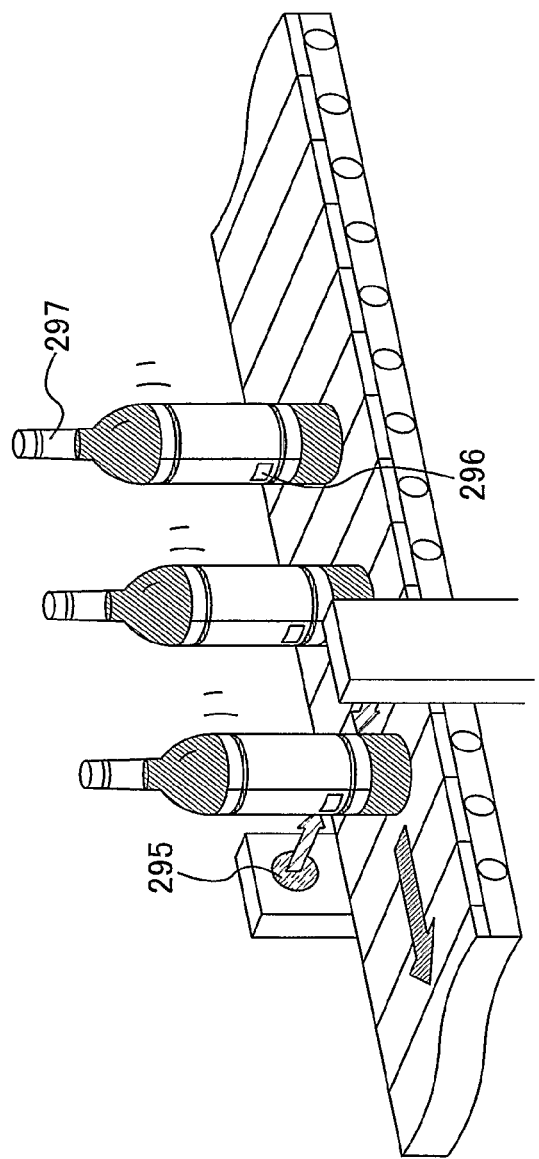
FIGS. 22A and 22B show modes of merchandise each mounting a wireless chip of the invention.
Figure 22A:
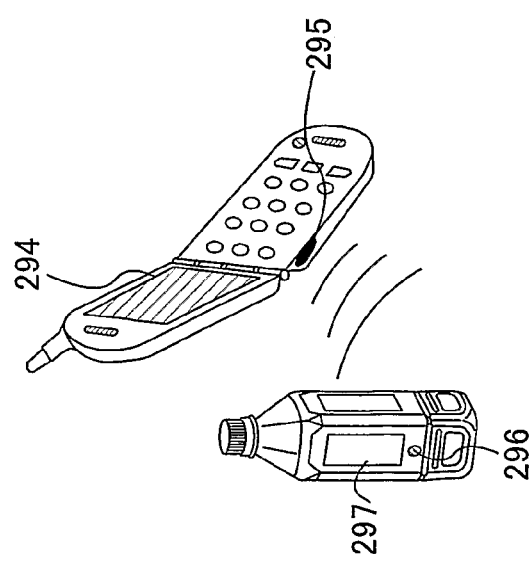
Figure 23:
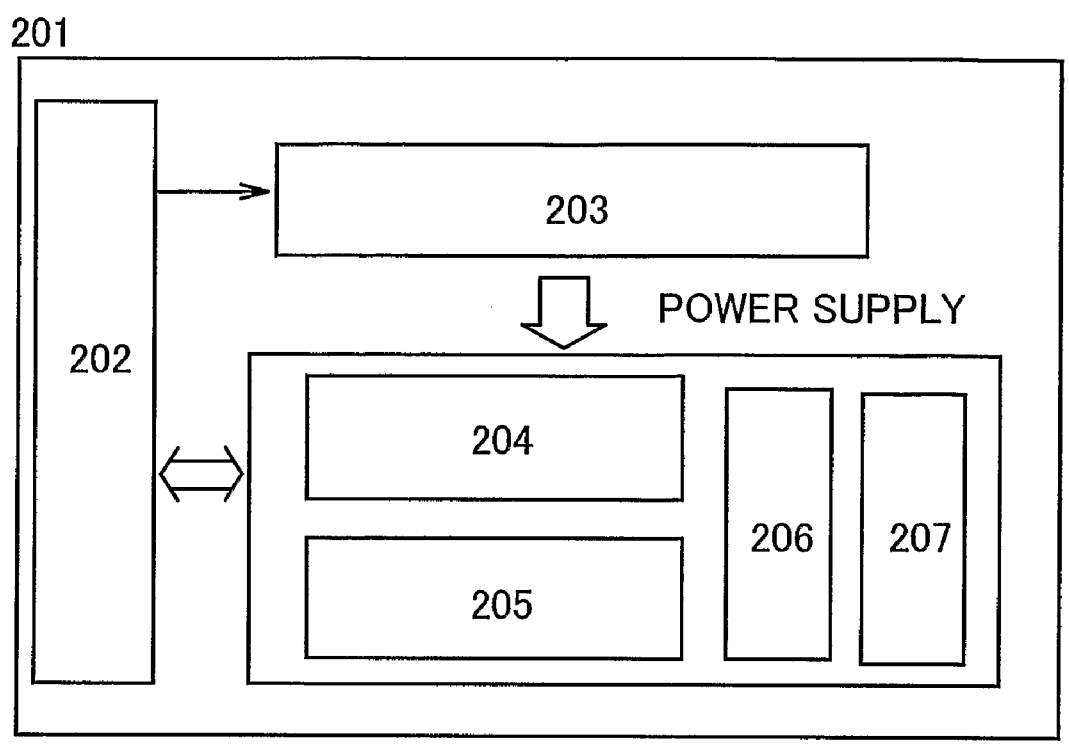
FIG. 23 is a diagram showing a configuration of a conventional wireless chip.

In addition, by applying the ID chip to merchandise management or circulation system, a higher function of the system can be achieved. For example, there is a case where a reader/writer 295 is provided on the side face of a portable terminal including a display portion 294, and an ID chip 296 is provided on the side face of a product 297 (see FIG. 22A). In this case, when the ID chip 296 is put close to the reader/writer 295, data on the raw material or place of origin of the product 297, a circulation record and the like is displayed on the display portion 294. Alternatively, there is a case where the reader/writer 295 is provided beside a belt conveyer (see FIG. 22B). In this case, a label mounted with an ID chip is attached to the product 297, and thus inspection can be carried out easily.

Further, the ID chip can be used for management of animals. For example, when an ID chip is implanted into an animal and the like, health condition thereof and the like can be managed. Alternatively, when the ID chip is attached to a pet collar and the like, whereabouts of the pet can be easily obtained when it is lost.

This embodiment can be freely implemented in combination with the aforementioned embodiment modes and embodiments.

The present application is based on Japanese Priority application No. 2004-247735 filed on Aug. 27, 2004 with the Japanese Patent Office, the entire contents of which are hereby incorporated by reference.

The invention claimed is:

1. A wireless chip comprising:
    an antenna circuit having a first terminal and a second terminal for outputting two signals, and a boosting power source circuit including a thin film transistor, wherein the boosting power source circuit includes:
    a rectifier circuit having a third terminal for receiving a signal from the first terminal of the antenna circuit, a fourth terminal for receiving a signal from the second terminal of the antenna circuit, and a fifth terminal for outputting a potential; and a boosting circuit having a sixth terminal for receiving a signal from the first terminal of the antenna circuit, a seventh terminal for receiving a signal from the second terminal of the antenna circuit, an eighth terminal for receiving the potential, a ninth terminal for outputting a power source potential, and a tenth terminal for outputting a ground potential, wherein the first terminal of the antenna circuit is connected to the third terminal of the rectifier circuit and the sixth terminal of the boosting circuit, wherein the second terminal of the antenna circuit is connected to the fourth terminal of the rectifier circuit and the seventh terminal of the boosting circuit, wherein the fifth terminal of the rectifier circuit is connected to the eighth terminal of the boosting circuit, and wherein the power source potential is higher than the potential.

2. A wireless chip comprising:

an antenna circuit having a first terminal and a second terminal for outputting two signals, and a boosting power source circuit including a thin film transistor, wherein the boosting power source circuit includes:

a rectifier circuit having a third terminal for receiving a signal from the first terminal of the antenna circuit, a fourth terminal for receiving a signal from the second terminal of the antenna circuit, a fifth terminal for outputting a first potential, and an eleventh terminal for outputting a second potential; and a boosting circuit having a sixth terminal for receiving a signal from the first terminal of the antenna circuit, a seventh terminal for receiving a signal from the second terminal of the antenna circuit, an eighth terminal for receiving the first potential, a twelfth terminal for receiving the second potential, a ninth terminal for outputting a power source potential, and a tenth terminal for outputting a ground potential, wherein the first terminal of the antenna circuit is connected to the third terminal of the rectifier circuit and the sixth terminal of the boosting circuit, wherein the second terminal of the antenna circuit is connected to the fourth terminal of the rectifier circuit and the seventh terminal of the boosting circuit, wherein the fifth terminal and the eleventh terminal of the rectifier circuit are connected to the eighth terminal and the twelfth terminal of the boosting circuit respectively, and wherein the power source potential is higher than the first potential.

3. A wireless chip comprising:

an antenna circuit having a first terminal and a second terminal for outputting two signals, and a boosting circuit having two terminals for receiving a 2-phase clock signal, wherein the two terminals of the boosting circuit are connected to the first terminal and the second terminal of the antenna circuit, respectively, through capacitors.

4. The wireless chip according to any one of claims 1 and 2, wherein the boosting circuit includes a plurality of boosting units; wherein a voltage is boosted in a boosting unit of an odd-numbered stage by using a signal inputted from the first terminal of the antenna circuit; and wherein a voltage is boosted in a boosting unit of an even-numbered stage by using a signal inputted from the second terminal of the antenna circuit.

5. The wireless chip according to any one of claims 1 and 2, wherein a logic circuit constituting the wireless chip uses the power source potential as power.

6. The wireless chip according to any one of claims 1 and 2, wherein the boosting power source circuit is constructed of analog circuits.

7. The wireless chip according to any one of claims 1 and 2, wherein the boosting power source circuit receives only a signal from the terminals of the antenna circuit, and outputs the power source potential and the ground potential.

8. The wireless chip according to any one of claims 1, 2 and 3, wherein a potential difference of signals inputted to the input terminals of the boosting circuit with time shows an analog AC waveform.

9. The wireless chip according to any one of claims 1, 2, and 3, wherein a potential difference between signals inputted to the input terminals of the boosting circuit changes periodically and continuously.

* * * * *